(12) United States Patent
Douki et al.

(10) Patent No.: US 9,299,599 B2
(45) Date of Patent: Mar. 29, 2016

(54) THERMAL PROCESSING APPARATUS FOR THERMAL PROCESSING SUBSTRATE AND POSITIONING METHOD OF POSITIONING SUBSTRATE TRANSFER POSITION

(71) Applicant: TOKYO ELECTRON LIMITED, Tokyo (JP)

(72) Inventors: Yuichi Douki, Koshi (JP); Tokutarou Hayashi, Koshi (JP); Naruaki Iida, Koshi (JP); Suguru Enokida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 70 days.

(21) Appl. No.: 14/248,765

(22) Filed: Apr. 9, 2014

(65) Prior Publication Data

US 2014/0234991 A1   Aug. 21, 2014

Related U.S. Application Data

(63) Continuation of application No. 13/405,918, filed on Feb. 27, 2012, now Pat. No. 8,755,935.

(30) Foreign Application Priority Data

Mar. 2, 2011   (JP) .................................. 2011-045665

(51) Int. Cl.
  *H01L 21/00*   (2006.01)
  *H05B 3/68*   (2006.01)
  (Continued)

(52) U.S. Cl.
  CPC ............ *H01L 21/68* (2013.01); *H01L 21/6715* (2013.01); *H01L 21/67748* (2013.01);
  (Continued)

(58) Field of Classification Search
  CPC .................. H01L 21/67178; H01L 21/67109; H01L 21/67748; H01L 21/6715; H01L 21/67184; H01L 21/67745; H01L 21/67051; H01L 21/67103; H01L 21/67173; H01L 21/6719; G03F 7/168; G03F 7/3021; G03F 7/40; G03F 7/7075; B08B 1/04; F27B 17/0025; C23C 16/463
  USPC ............ 250/491.1; 118/719; 414/217, 217.1, 414/222.02, 935, 936, 941; 700/250, 254, 700/258; 702/95; 901/9, 40
  See application file for complete search history.

(56) References Cited

U.S. PATENT DOCUMENTS 5,513,948 A   5/1996   Bacchi et al.
5,539,323 A   7/1996   Davis, Jr.
(Continued)

FOREIGN PATENT DOCUMENTS

JP   10-006262 A1   1/1998
JP   10-294349 A1   4/1998
(Continued)

OTHER PUBLICATIONS

Japanese Office Action (Application No. 2011-045665) dated Jan. 29, 2013.
(Continued)

*Primary Examiner* — Gregory Adams
(74) *Attorney, Agent, or Firm* — Burr & Brown, PLLC

(57) ABSTRACT

A substrate holder positioning method, capable of positioning a substrate holder without using any positioning jig, includes: measuring a first position of a substrate held on a substrate holder included in a substrate carrying mechanism; carrying the substrate held on the substrate holder to a substrate rotating unit for holding and rotating the substrate; turning the substrate held by the substrate rotating unit through a predetermined angle by the substrate rotating unit; transferring the substrate turned by the substrate rotating unit from the substrate rotating unit to the substrate holder; measuring a second position of the substrate transferred from the substrate rotating unit to the substrate holder; determining the position of the center of rotation of the substrate rotating unit on the basis of the first and the second position; and positioning the substrate holder on the basis of the position of the center of rotation.

4 Claims, 18 Drawing Sheets

(51) Int. Cl.
  *C23C 16/00* (2006.01)
  *H01L 21/68* (2006.01)
  *H01L 21/67* (2006.01)
  *H01L 21/677* (2006.01)
  *H01L 21/687* (2006.01)
  *H01L 21/66* (2006.01)

(52) U.S. Cl.
  CPC ........ *H01L21/681* (2013.01); *H01L 21/68707* (2013.01); *H01L 22/10* (2013.01); *H01L 2924/0002* (2013.01)

(56) References Cited

U.S. PATENT DOCUMENTS

| | | | |
|---|---|---|---|
| 5,556,147 A | 9/1996 | Somekh et al. | |
| 5,620,560 A * | 4/1997 | Akimoto et al. | 216/41 |
| 5,980,194 A | 11/1999 | Freerks et al. | |
| 6,206,441 B1 | 3/2001 | Wen et al. | |
| 6,228,171 B1 * | 5/2001 | Shirakawa | 118/666 |
| 6,300,600 B1 * | 10/2001 | Ratliff et al. | 219/390 |
| 6,385,805 B2 * | 5/2002 | Konishi et al. | 15/77 |
| 6,618,645 B2 | 9/2003 | Bacchi et al. | |
| 6,629,053 B1 | 9/2003 | Mooring | |
| 6,643,604 B1 * | 11/2003 | Subramanian et al. | 702/130 |
| 6,822,413 B2 | 11/2004 | Simondet | |
| 6,857,838 B2 | 2/2005 | Kuroda | |
| 6,919,913 B1 * | 7/2005 | Inada et al. | 348/61 |
| 6,932,884 B2 * | 8/2005 | Saito et al. | 156/345.17 |
| 6,942,737 B2 * | 9/2005 | Sato | 134/6 |
| 6,949,143 B1 * | 9/2005 | Kurita et al. | 118/719 |
| 7,433,759 B2 | 10/2008 | Nangoy | |
| 7,522,823 B2 * | 4/2009 | Fukumoto et al. | 392/418 |
| 7,601,934 B2 * | 10/2009 | Quach et al. | 219/444.1 |
| 7,884,622 B2 | 2/2011 | Doki et al. | |
| 8,055,376 B2 | 11/2011 | Doki et al. | |
| 2005/0016818 A1 | 1/2005 | Ito et al. | |
| 2005/0287821 A1 * | 12/2005 | Higashi et al. | 438/780 |
| 2006/0011133 A1 * | 1/2006 | Nishibayashi | 118/630 |
| 2006/0130767 A1 * | 6/2006 | Herchen | 118/728 |
| 2006/0165409 A1 * | 7/2006 | Akimoto et al. | 396/611 |
| 2006/0201616 A1 * | 9/2006 | Matsuoka et al. | 156/272.2 |
| 2006/0266290 A1 * | 11/2006 | Kiyota | 118/719 |
| 2007/0048979 A1 * | 3/2007 | Fukuoka et al. | 438/490 |
| 2007/0077171 A1 * | 4/2007 | Hamada | 422/63 |
| 2007/0122551 A1 * | 5/2007 | Yamamoto et al. | 427/240 |
| 2007/0169373 A1 * | 7/2007 | Aoki et al. | 34/549 |
| 2008/0185370 A1 * | 8/2008 | Fukuoka et al. | 219/385 |
| 2009/0062959 A1 | 3/2009 | Sakhare et al. | |

FOREIGN PATENT DOCUMENTS

| | | |
|---|---|---|
| JP | 2005-011966 A1 | 1/2005 |
| JP | 2005-019963 A1 | 1/2005 |
| JP | 2008-109027 A1 | 5/2008 |
| JP | 2009-054665 A1 | 3/2009 |

OTHER PUBLICATIONS

Japanese Office Action (Application No. 2013-049930) dated Jan. 14, 2014.

* cited by examiner

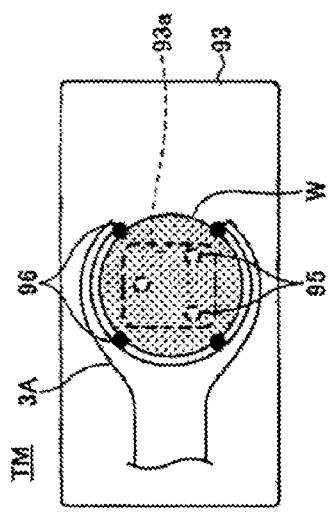
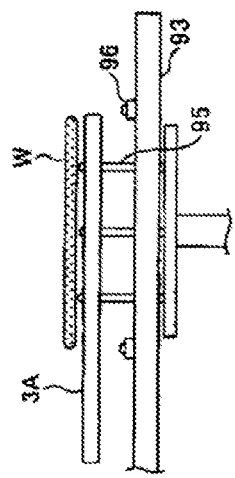
FIG. 18G
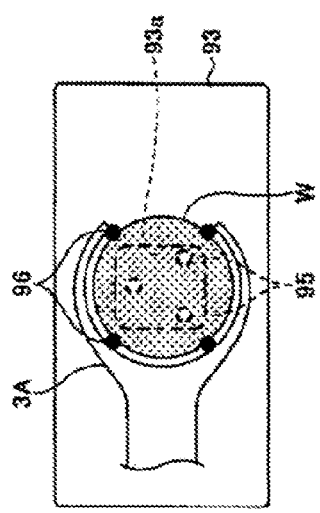
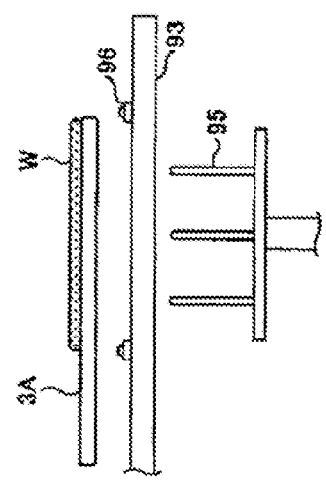
FIG. 18H
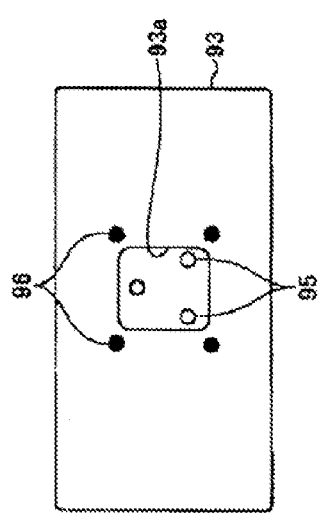
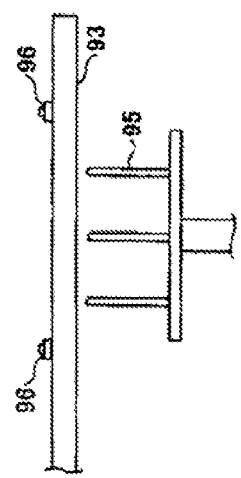
FIG. 18I
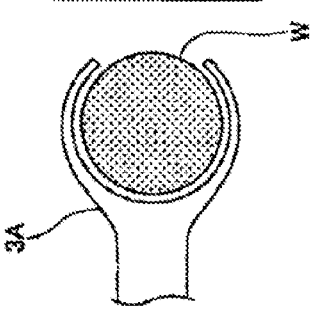

THERMAL PROCESSING APPARATUS FOR THERMAL PROCESSING SUBSTRATE AND POSITIONING METHOD OF POSITIONING SUBSTRATE TRANSFER POSITION

CROSS REFERENCE TO RELATED APPLICATION

This application is a continuation of U.S. application Ser. No. 13/405,918, filed Feb. 27, 2012, the entirety of which is incorporated herein by reference.

FIELD OF THE INVENTION

The present invention relates to a substrate holder positioning method, and a substrate processing system.

BACKGROUND OF THE INVENTION

A substrate processing system is used for fabricating semiconductor devices including flat panel displays (FPDs). The substrate processing system has processing modules and a substrate carrying mechanism for carrying a substrate from and to the processing modules. The substrate carrying mechanism of the substrate processing system delivers substrates sequentially to the processing modules. The processing modules process the substrates by predetermined processes, respectively. It is possible that the entire surface of the substrate cannot be uniformly processed unless the substrate is positioned correctly at a predetermined position in each processing module. Although the substrate carrying mechanism is constructed so as to exhibit high carrying accuracy, a positioning operation is essential to accurately positioning the substrate.

A substrate holder positioning method disclosed in, for example, Patent document 1 or 2 carries a positioning device provided with a detector, such as a camera or an image sensor, by the substrate holder, determines a distance of the substrate holder from a predetermined reference position on the basis of the position of the substrate holder determined by the detector, and then executes a correcting operation, namely, a teaching operation, for correcting the dislocation of the substrate holder from the reference position.

DOCUMENTS OF BACKGROUND ART

Patent document 1: JP-A 2009-54665
Patent document 2: JP-A 2008-109027

SUMMARY OF THE INVENTION

When the positioning device is employed, it is possible that the positioning device causes a positioning error unless the positioning device is inspected and calibrated frequently. If the positioning device is not properly handled, correct positioning cannot be achieved in some cases. The positioning device is comparatively expensive and, in some cases, a plurality of positioning devices suitable to the respective shapes of the processing modules to which substrates are carried are needed. Those positioning devices increase the cost of the substrate holder considerably. Therefore, it is desired to position the substrate holder without using any positioning device.

The present invention provides a substrate holder positioning device capable of positioning a substrate holder at a desired position without using any positioning device, and a substrate processing system.

A substrate holder positioning method in a first mode of the present invention includes the steps of: measuring a first position of a substrate held by a substrate holder included in a substrate carrying mechanism; carrying the substrate held by the substrate holder to a substrate rotating unit for holding and rotating the substrate; turning the substrate held by the substrate rotating unit through a predetermined angle by the substrate rotating unit; transferring the substrate turned by the substrate rotating unit from the substrate rotating unit to the substrate holder; measuring a second position of the substrate transferred from the substrate rotating unit to the substrate holder; determining a position of a center of rotation of the substrate rotating unit on the basis of positions determined respectively of the first and the second position measuring; and positioning the substrate holder on the basis of the center of rotation.

A substrate processing system including: a substrate carrying mechanism including a substrate holder for holding and carrying a substrate; position measuring devices combined with the substrate holder to measure the position of the substrate held by the substrate holder; a substrate rotating unit for holding and rotating the substrate, capable of receiving the substrate from and returning the substrate to the substrate holder; and a control unit for determining the position of the center of rotation of the substrate rotating unit on the basis of a first position of the substrate held by the substrate holder and a second position of the substrate held by the substrate holder after the substrate has been turned through a predetermined angle by the substrate rotating unit and has been received from the substrate rotating unit measured by the position measuring devices, and positioning the substrate holder on the basis of the position of the center of rotation of the substrate rotating unit.

A substrate processing system in a third mode of the present invention includes: a substrate support unit onto which a substrate holder included in a substrate carrying mechanism delivers a substrate; and three or more substrate support members capable of coming into contact with the edge of the substrate held by the substrate holder to support the substrate and arranged such that the position of the substrate supported on the three or more substrate support members corresponds to a correct position of the substrate on the substrate support unit.

A substrate holder positioning method of positioning a substrate holder included in a substrate carrying mechanism, to be executed by a substrate processing system including a substrate support unit onto which a substrate holder of the substrate carrying mechanism delivers a substrate, and three or more substrate support members capable of coming into contact with the edge of the substrate supported on the substrate support unit to support the substrate and arranged such that a position of the substrate supported on the three or more substrate support members coincides with a correct position of the substrate on the substrate support unit, including the steps of: carrying a substrate by the substrate holder and supporting the substrate on the three or more substrate support members; transferring the substrate supported on the three or more substrate support members from the three or more substrate support members to the substrate holder; measuring the position of the substrate held by the substrate holder; and positioning the substrate holder on the basis of the measured position of the substrate.

A substrate holder positioning method of positioning a substrate holder included in a substrate carrying mechanism in a fifth mode of the present invention includes the steps of: holding a substrate by the substrate holder included in the substrate carrying mechanism; determining whether or not there is a substrate by a substrate detector mounted on the substrate holder by lowering the substrate holder holding a substrate from a position above a substrate support unit on which the substrate is to be placed toward the substrate support unit by a predetermined distance; repeating the step of determining whether or not there is a substrate when it is determined that there is a substrate; and deciding, when it is decided that there is no substrate in the step of determining whether or not there is a substrate, that the position of the substrate holder at a moment when it is decided that there is no substrate is a reference position of the substrate holder with respect to a vertical direction.

A substrate holder positioning method in a sixth mode of the present invention includes the steps of: supporting a substrate by a central part of the back surface of the substrate by a back support unit; advancing a substrate holder included in a substrate carrying mechanism to a position under the substrate supported by the back support unit; determining whether or not there is a substrate by a substrate detecting unit mounted on the substrate holder by raising the substrate holder by a predetermined distance toward the substrate and; repeating the step of determining whether or not there is a substrate when it is decided that there is no substrate in the step of detecting whether or not there is a substrate; and deciding that the position of the holding unit at a moment when it is decided that there is s substrate in the step of determining whether or not there is a substrate is a reference position with respect to a vertical direction.

The substrate holder positioning method and the substrate processing system can position the substrate holder without using any positioning device.

BRIEF DESCRIPTION OF THE DRAWINGS

FIGS. 18G, 18H and 18I are views of assistance in explaining steps subsequent to those shown in FIGS. 17D to 17F of the substrate position measuring method included in the substrate holder positioning method in the third embodiment of the present invention.

DETAILED DESCRIPTION OF THE INVENTION

Figure 1:
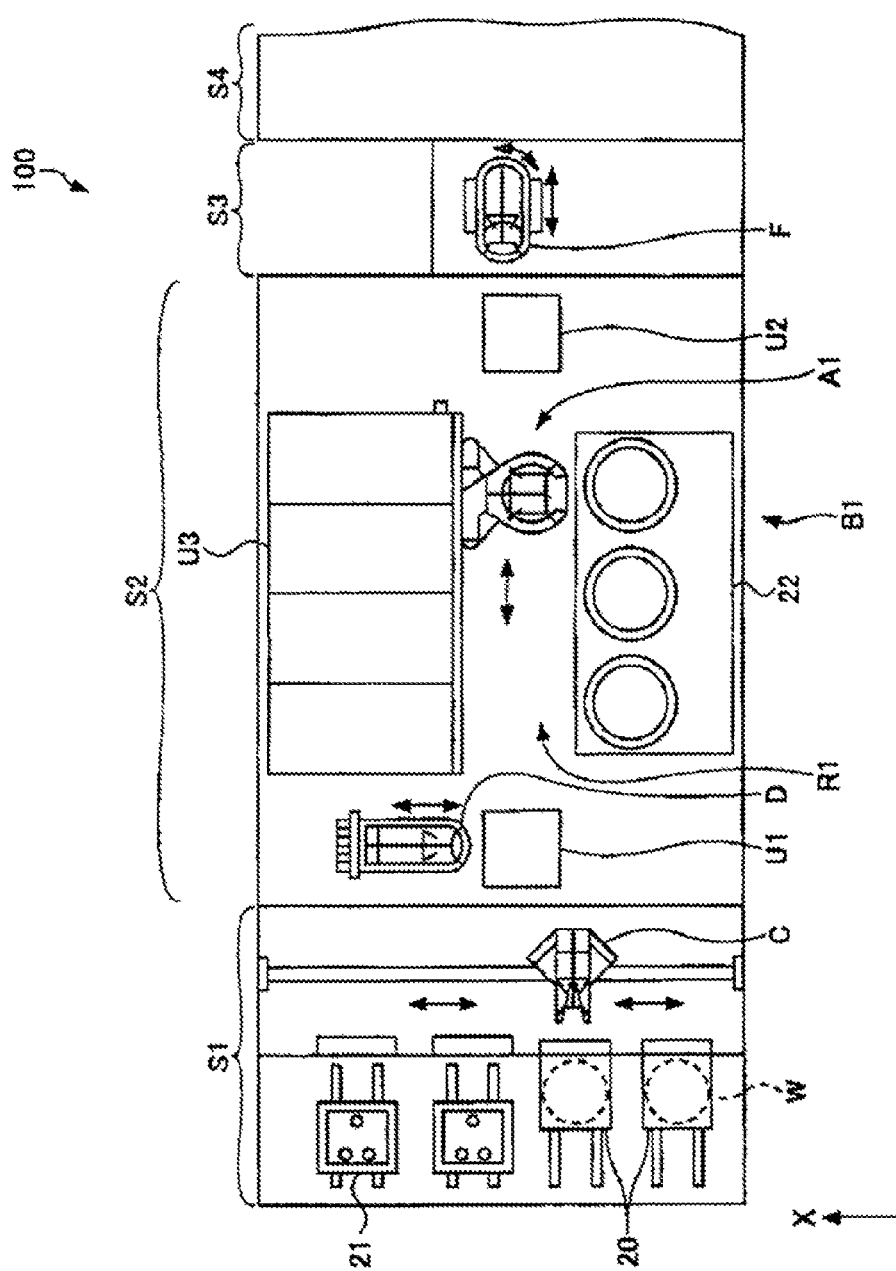
FIG. 1 is a plan view of a coating and developing system in a preferred embodiment of the present invention for coating a substrate with a photoresist film and developing the exposed photoresist film.
Figure 2:
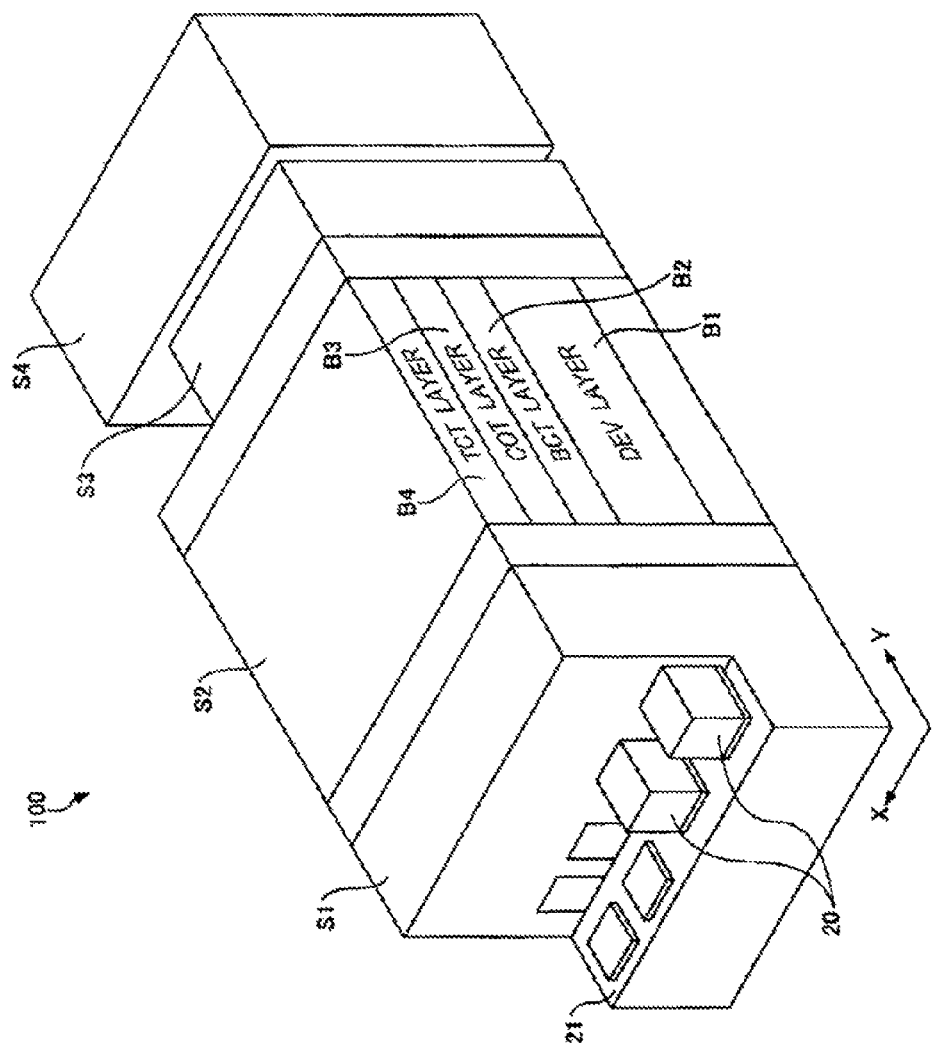
FIG. 2 is a schematic perspective view of the coating and developing system shown in FIG. 1.

Nonlimitative embodiments of the present invention will be described with reference to the accompanying drawings, in which the same or corresponding members or parts are designated by the same of corresponding reference characters and the duplicate description thereof will be omitted.
Coating and Developing System A coating and developing system 100 in a preferred embodiment of the present invention will be described with reference to FIGS. 1 to 4. Referring to FIGS. 1 and 2, the coating and developing system 100 has a carrier station S1, a processing station S2 and an interface station S3 arranged in that order. An exposure system S4 is connected to the interface station S3 of the coating and developing system 100.

The carrier station S1 is provided with support tables 21 and a carrying mechanism C. A carrier 20 containing a predetermined number of semiconductor wafers (hereinafter referred to simply as "wafer") W is placed on the support table 21. In this embodiment, four carriers 20 can be placed on the support tables 21. In the following description, a direction in which carriers 20 are arranged is an X-direction and a direction perpendicular to the X-direction is a Y-direction. The carrying mechanism C takes out a wafer W from the carrier 20, carries the wafer W into the processing station S2, receives a processed wafer W processed in the processing station and returns the processed wafer W to the carrier 20.

As shown in FIGS. 1 and 2, the processing station S2 is connected to the rear side, namely, the side on the +Y-direction, of the carrier station S1. The processing station S2 has a shelf unit U1, a shelf unit U2, a first block B1, namely, a DEV layer B1, a second block B2, namely, a BCT layer B2, a third block B3, namely, a COT layer B3, and a fourth block B4, namely, a TCT layer B4.

Figure 3:
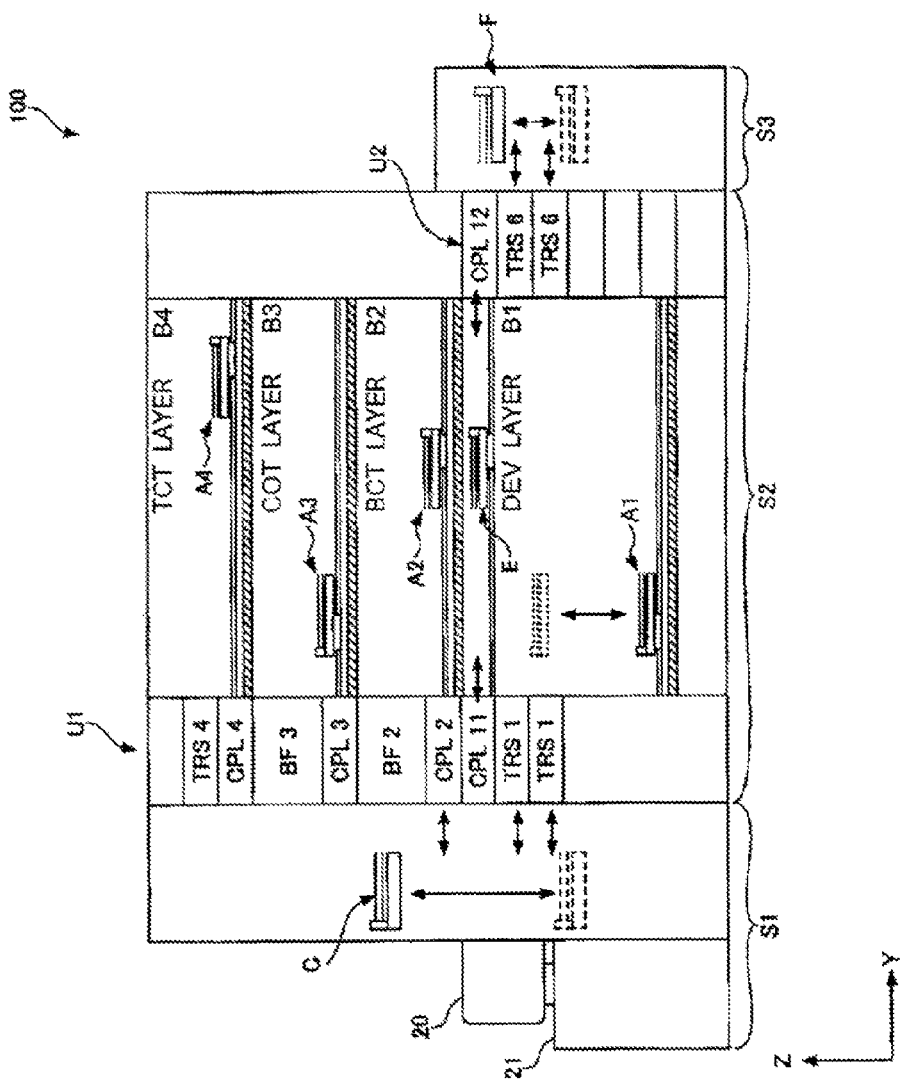
FIG. 3 is a side elevation of the coating and developing system shown in FIG. 1.

Referring to FIG. 3, the shelf unit U1 has transfer modules TRS1, TRS1, CPL11, CPL2, BF2, CPL3, BF3, CPL4 and TRS4, which are stacked up in that order. As shown in FIG. 1, a carrying mechanism D capable of moving in vertical directions is installed on the +X-direction side of the shelf unit U1. The carrying mechanism D carries a wafer W to and from the modules of the shelf unit U1.

As shown in FIG. 3, the shelf unit U2 has transfer modules TRS6, TRS6 and CPL12 stacked up in that order.

Some of the transfer modules designated by "CPL+numeral" serve also as heating modules for heating a wafer W and some of the transfer modules designated by "CPL+numeral" serve also as cooling modules for cooling a wafer W and keeping a wafer W at a predetermined temperature, such as 23° C. The transfer modules designated by "BF+numeral" serve also as buffer modules capable of holding a plurality of wafers W. The transfer modules TRS, CPL and BF are provided with a support unit on which a wafer W is placed.

Third Block of Processing Station

Figure 4:
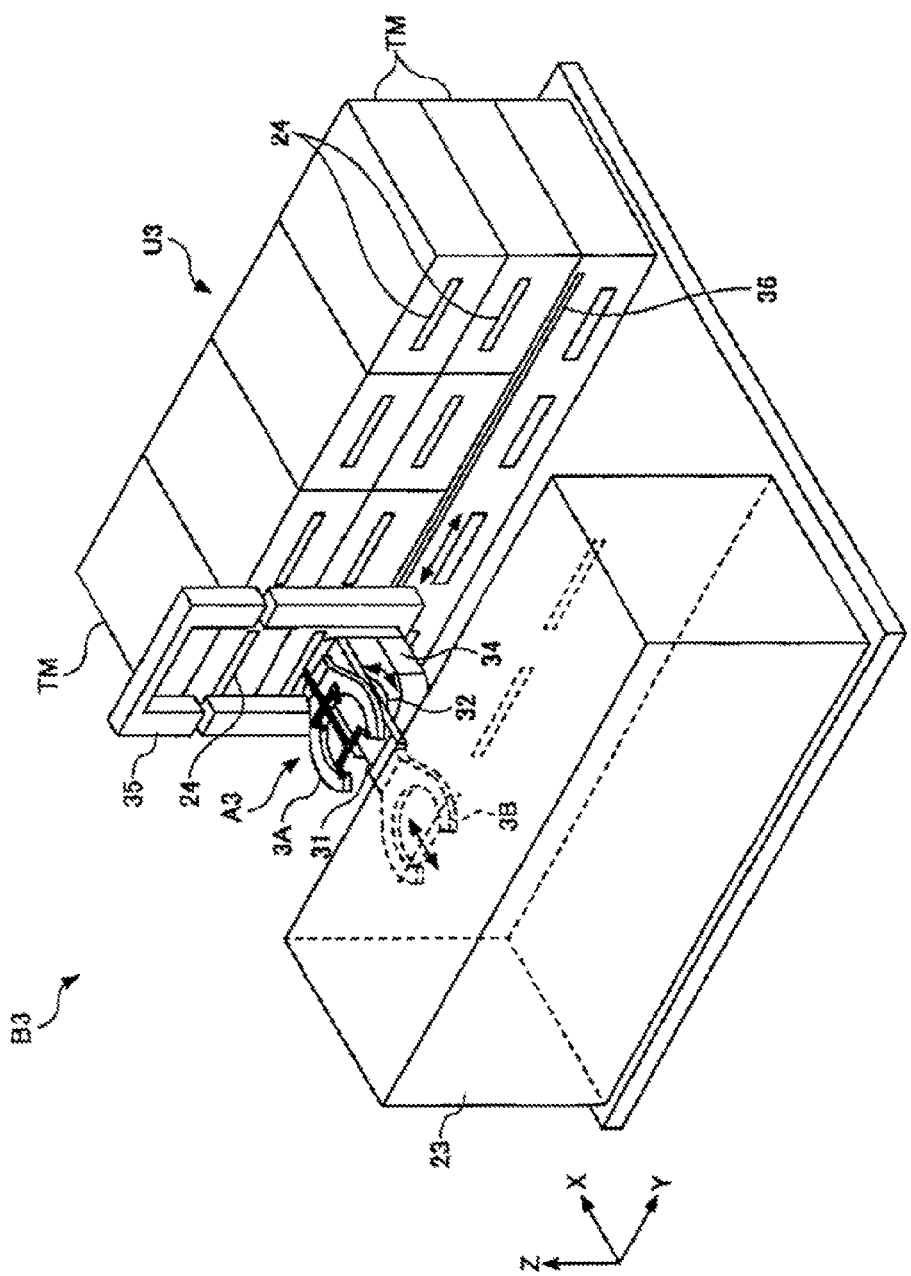
FIG. 4 is a perspective view of a third block included in the coating and developing system shown in FIG. 1.
Figure 5:
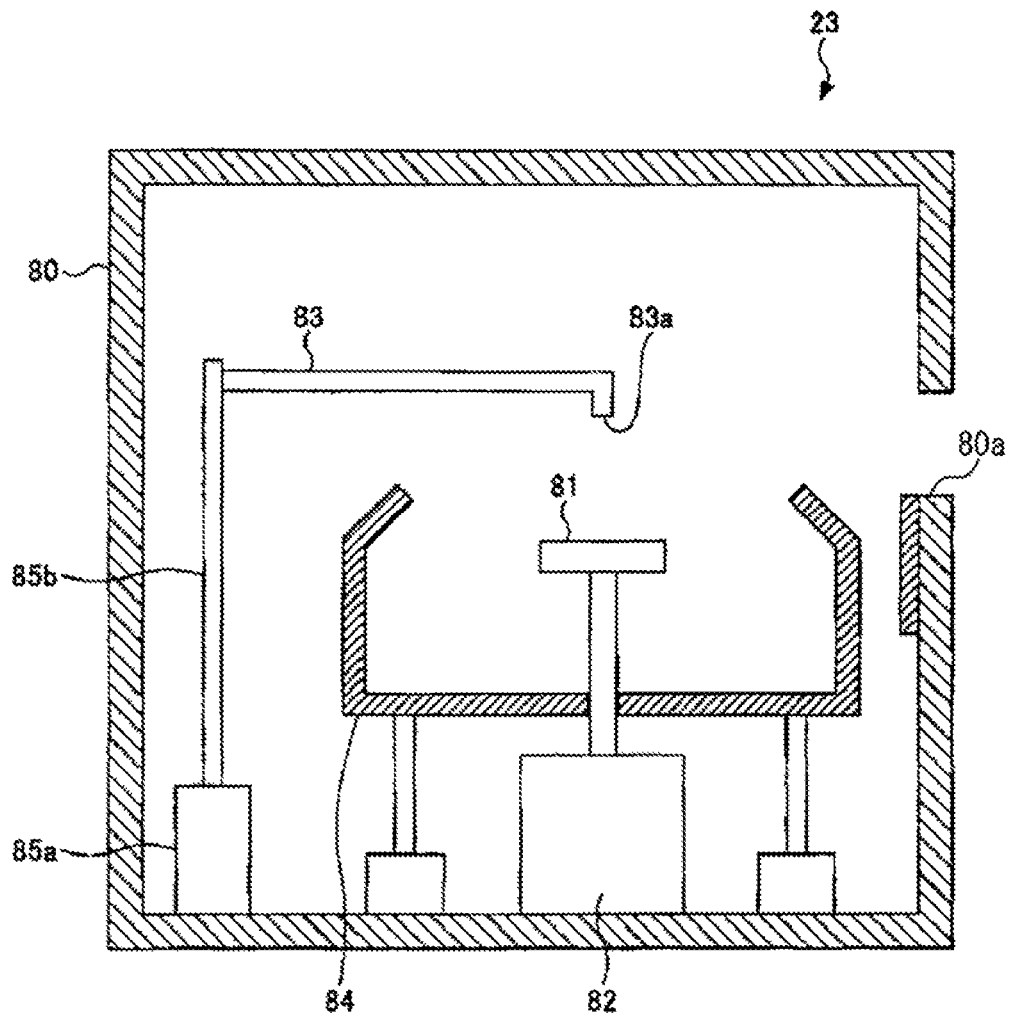
FIG. 5 is a schematic side elevation of a coating module included in the third block shown in FIG. 4.

The third block B3 will be described with reference to FIGS. 4 to 6. As shown in FIG. 4, the third block B3 has a coating module 23, a shelf unit U3 and a carrying arm A3. As shown in FIG. 5, the coating module 23 has a box 80, a spin chuck 81, a drive unit 82, a chemical solution pouring nozzle 83 and a cup 84. The spin chuck 81, the drive unit 82, the chemical solution pouring nozzle 83 and the cup 84 are installed in the box 80. The box 80 is provided with a gate 80a. The carrying arm A3 carries a wafer W into and out of the box 80 through the gate 80a. A suction device, not shown attracts a wafer W to and holds the same on the spin chuck 81 with a central part of the back surface of the wafer W in close contact with the spin chuck 81. The drive unit 82 can support the spin chuck 81, can rotate the spin chuck 81 and can move the spin chuck 81 vertically. The chemical solution pouring nozzle 83 is supported on a support shaft 85b supported by a supporting and driving unit 85a. The supporting and driving unit 85a turns the support shaft 85b to position the tip 83a of the chemical solution pouring nozzle 83 at either a home position outside the cup 84 or a chemical solution pouring position substantially above the center of a wafer W held on the spin chuck 81. The cup 84 surrounds a wafer W held on the spin chuck 81 to arrest the chemical solution poured onto a wafer held on the spin chuck 81 and scattered by the wafer W. The cup 84 is provided in its bottom wall with a drain port for draining the arrested chemical solution. The chemical solution used by the coating module 23 is a photoresist solution. The third block B3 forms a photoresist film on a wafer W.

As shown in FIG. 4, the shelf unit U3 of the third block B3 is disposed opposite to the coating module 23 and is provided with a thermal module TM. The heating module TM carries out pretreatment and post-treatment to form a photoresist film. The thermal module TM is provided with a gate 24 through which a wafer W is carried into and carried out of the thermal module TM. The carrying arm A3 is installed in a space between the coating module 23 and the shelf unit U3.

Figure 6A:
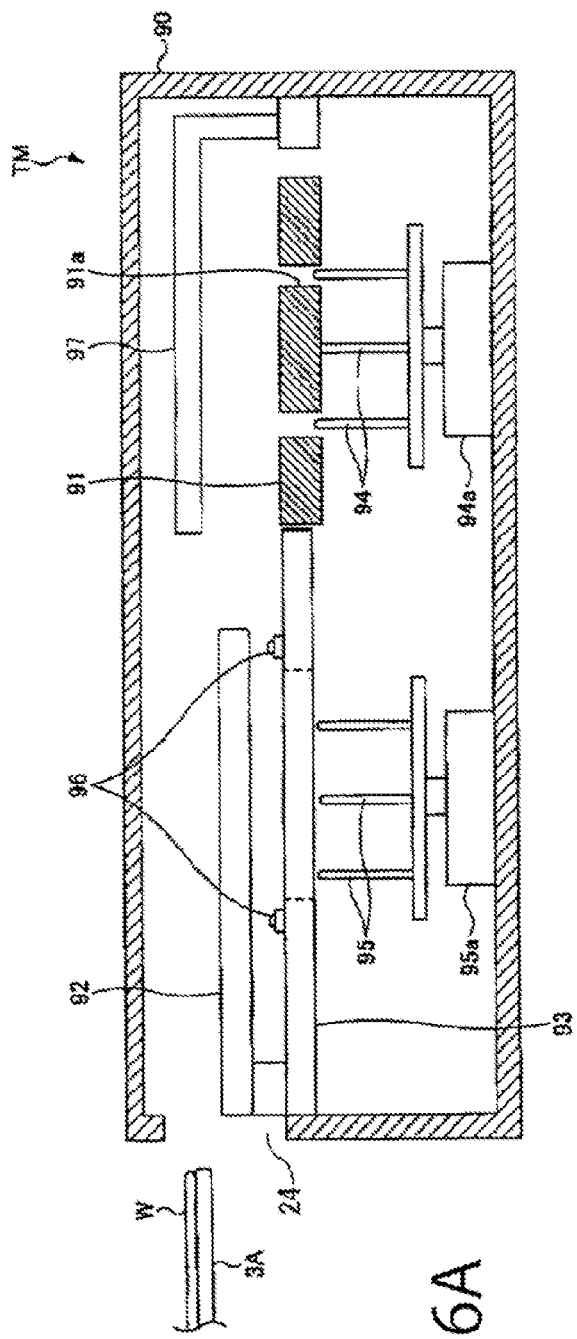
FIGS. 6A, 6B and 6C are views of assistance in explaining a heating module included in the third block shown in FIG. 4.
Figure 6C:
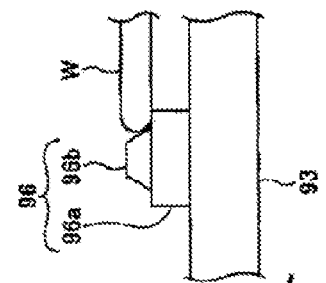
Figure 6B:
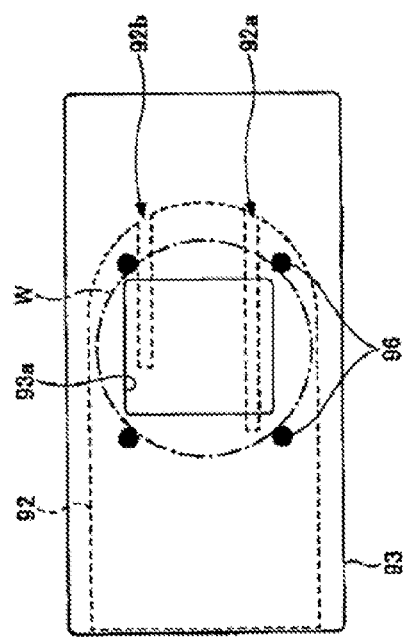

The thermal module TM will be further described with reference to FIGS. 6A to 6C showing the thermal module TM in a sectional view. The thermal module TM has a box 90, and a heating plate 91, a cooling plate 92 and support plate 93, which are placed in the box 90. The heating plate 91 has the shape of a circular plate of a diameter greater than the diameter of a wafer W. The heating plate 91 is internally provided with, for example, a heating wire, not shown, or the like. The heating plate 91 is heated at a predetermined temperature. The heating plate 91 is provided with, for example, three through holes 91a. Only the two through holes 91a are shown in FIG. 6. Three lifting pins 94 corresponding to the three through holes 91a can be vertically moved in the through holes 91a by a drive unit 94a. Thus, the lifting pins 94 can place a wafer W on the heating plate 91 and can lift up a wafer W placed on the heating plate 91. In FIG. 6A, indicated at 97 is a cooling fan for cooling a wafer W heated by the heating plate 91 and transferred to the cooling plate 92.

As shown in FIG. 6B, the cooling plate 92 has the shape of a plate having a width and a length greater than the diameter of a wafer W. A part of the cooling plate 92 on the side of the heating plate 91 is provided with slits 92a and 92b opening toward the heating plate 91. The slits 92a and 92b permit a drive unit 95a to move lifting pins 95 vertically through the cooling plate 92. The carrying arm A3 (FIG. 4) carries a wafer through the gate 24 into the box 90 and holds the wafer W above the cooling plate 92. Then, the lifting pins 95 are lifted up through the slits 92a and 92b so as to project from the upper surface of the cooling plate 92 to receive the wafer W from the carrying arm A3. The wafer W is placed on the cooling plate 92 after the carrying arm A3 has been withdrawn from the box 90. The cooling plate 92 can be moved horizontally by a horizontal drive unit, not shown, between a position above the support plate 92 and a position above the heating plate 91. The cooling plate 92 also functions as a substrate holder in the box 90. For example, the lifting pins 94 are raised up through the through holes 91a of the heating plate 91 and the slits 92a and 92b of the cooling plate 92 when the cooling plate supporting the wafer W is moved at a position above the heating plate 91 to transfer the wafer W from the cooling plate 92 to the lifting pins 94. After the cooling plate has been returned to the position above the support plate 92, the lifting pins 94 are lowered to place the wafer W on the heating plate 91. When the wafer W placed on the heating plate 94 is lifted up by the lifting pins 94, the cooling plate 92 is moved into a space between the wafer W and the heating plate 91. Since the lifting pins 94 enter the slits 92a and 92b of the cooling plate in this state, the cooling plate 92 can be positioned above the heating plate 91. The lifting pins 94 are lowered to place the wafer W on the cooling plate 92. Subsequently, the cooling plate 92 is returned to the position above the support plate 92, the lifting pins 95 transfers the wafer W from the cooling plate 92 to the carrying arm A3 and the carrying arm A3 carries the wafer W out of the thermal module TM.

The cooling plate 92 is internally provided with a conduit through which a cooled or temperature-controlled medium flows. The medium supplied by a temperature controller, not shown, flows through the conduit to keep the cooling plate 92 at a predetermined temperature. When a wafer W heated by the heating plate 91 is transferred to the cooling plate 92, the cooling plate 92 starts cooling the wafer W immediately. Therefore, time needed to thus cool the wafer W is shorter than time needed to cool the wafer W by a cooling module after carrying the wafer W out of the thermal module.

Referring to FIG. 6B, the support plate 92 under the cooling plate 92 has a rectangular shape and is provided substantially in a central part thereof with an opening 93a. The lifting pins 95. The opening 93a avoids obstructing the vertical movement of the lifting pins 95 by the support plate 93. Four wafer support pads 96 are arranged on the upper surface of the support plate 93. As shown in FIG. 6C, each of the support pads 96 has a lower part 96a having the shape of a circular cylinder and an upper part 96b having the shape of a truncated circular cone and formed on the lower part 96a.

As shown in FIG. 6C, the wafer support pads 96 are arranged such that a wafer is located with its edge in contact with the lower ends of the upper parts 96b having the shape of a truncated circular cone and the upper surfaces of the lower part 96a. The wafer support pads 96 are arranged such that the center of a wafer W located by the wafer support pads 96 and the center of the cooling plate 92 are on a vertical axis. The wafer support pads 96 and their arrangement will be described.

The cooling plate 92 of the thermal module TM is moved to a position above the heating plate 91. Then, the carrying arm A3 carries a wafer W into the box 90 of the thermal module TM and holds the wafer W above the support plate 93. Then, the drive unit 95a raises the lifting pins 95 to transfer the wafer W from the carrying arm A3 to the lifting pins 95. The drive unit 95a lowers the lifting pin 95 after the carrying arm A3 after the carrying arm A3 has been withdrawn from the box 90 to support the wafer W on the wafer support pads 96 of the support plate 93. If the edge of the wafer W comes into contact with the conical surface of the upper parts 96b of the wafer support pads 96, the wafer W slides down along the conical surfaces and rests on the upper surfaces of the lower parts 96a. Thus, the position of the edge of the wafer W is regulated by the four wafer support pads 96. Subsequently, the wafer W is lifted up from the wafer support pads 96 by the lifting pins 95 and is held by the carrying arm A3. Then, the cooling plate 92 is returned to the position above the support plate 93 and the wafer W is transferred from the carrying arm A3 to the cooling plate 92 by the coordinated operations of the carrying arm A3 and the lifting pins 95. The wafer W is transferred from the cooling plate 92 to the heating plate 91 such that the center of the wafer W coincides with that of the heating plate 91 by operations mentioned above. Thus, the wafer W positioned in place on the support plate 93 by the wafer support pads 96 can be correctly positioned on the heating plate 91; that is, the respective positions of the four wafer support pads 96 on the support plate 93 are determined such that the center of the wafer W placed on the heating plate 91 coincides with that of the heating plate 91 when the wafer W is positioned on the wafer support plate 96 by the wafer support pads 96.

Referring to FIGS. 1 and 3, the first block B1 has developing modules 22, a carrying arm A1 and a shuttle arm E. More specifically, the first block B1 has the two developing modules 22 stacked up vertically. Each developing module 22 is the same in construction as the coating module 23. The developing module 22 wets an exposed photoresist film formed on the surface of a wafer W with a developer, namely, a chemical solution, to develop the photoresist film. The carrying arm A1 carries wafers W to the two developing modules 22. The shuttle arm E carries a wafer between a transfer module CPL11 included in the shelf unit U1 and a transfer module CPL12 included in the shelf unit U2.

The second block B2 and the fourth block B4 are the same in construction as the third block B3. The second block B2 uses a chemical solution for forming an antireflection film to form a lower antireflection film under the photoresist film. The fourth block Br uses a chemical solution for forming an antireflection film to form an upper antireflection film on the photoresist film. As shown in FIG. 3, the respective carrying arms of the second block B2 and the fourth block B4 are designated by A2 and A4, respectively.

The interface station S3 is connected to an end of the processing station S2 on a far side with respect to the +Y-direction. An interface arm F is installed in the interface station S3 as shown in FIG. 1. The interface arm F is disposed on a far side of the shelf unit U2 of the processing station S2 with respect to the +Y-direction side. The interface arm F carries wafers W from and to the modules of the shelf unit U2 and from and to the modules and the exposure system S4.

Transfer of Wafer in the Coating and Developing System

A wafer W is carried to the modules of the coating and developing system 100 in the following manner to subject the wafer W to processes assigned to the modules. Referring to FIG. 3, the carrying mechanism C of the carrier station S1 takes out a wafer W from a carrier 20 placed on the support table 21 and carries the wafer W to the transfer module CPL2 of the shelf unit U1 of the processing station S2. The wafer W carried to the transfer module CPL2 is carried sequentially to the modules of the second block B2, namely, the thermal module and the coating module by the carrying arm A2 of the second block B2 to form a lower antireflection film on the wafer W.

The carrying arm A2 carries the wafer W coated with the lower antireflection film to the transfer module BF2 of the shelf unit U1, and then the carrying mechanism D (FIG. 1) carries the wafer W to the transfer module CPL3 of the shelf unit U1. Then, the carrying arm A3 of the third block B3 carries the wafer W from the transfer module CPL3 sequentially to the modules, namely, the thermal module TM and the coating module 23, of the third block B3 to form a photoresist film on the lower antireflection film. Then, the carrying arm A3 carries the wafer W coated with the lower antireflection film and the photoresist film to the transfer module BF3 of the shelf unit U1.

In some cases, an upper antireflection film is formed on the resist film formed on the wafer W in the fourth block B4. When an upper antireflection film needs to be formed on the photoresist film, the wafer W is transferred through the transfer module CPL4 to the carrying arm A4 of the fourth block B4. The carrying arm A4 carries the wafer sequentially to the modules, namely, the thermal module and the coating module, of the fourth block B4 to form an upper antireflection film on the photoresist film. Then, the carrying arm A4 carries the wafer to the transfer module TRS4 of the shelf unit U1.

The carrying mechanism D carries the wafer W coated with the photoresist film or the wafer W coated with the photoresist film and the upper antireflection film from the transfer module BF3 or the transfer module TRS4 to the transfer module CPL11. The shuttle arm E carries the wafer W from the CPL11 to the transfer module CPL12 of the shelf unit U2. The interface arm F of the interface station picks up the wafer from the transfer module CPL12 of the shelf unit U2.

Subsequently, the interface arm F carries the wafer W to the exposure system S4 to subject the wafer W to an exposure system. The interface arm F carries the wafer W processed by the exposure process to the transfer module TRS6 of the shelf unit U2 of the processing station S2. The wafer W returned to the processing station S2 is carried to the first block B1 to subject the wafer W to a developing process. The carrying arm A1 carries the wafer W processed by the developing process to the transfer module TRS1 of the shelf unit U1, and then, the carrying mechanism C returns the wafer to the carrier 20.

Carrying Arm

The carrying arm A3 installed in the third block B3 will be described with reference to FIGS. 7 to 9.

Figure 7:
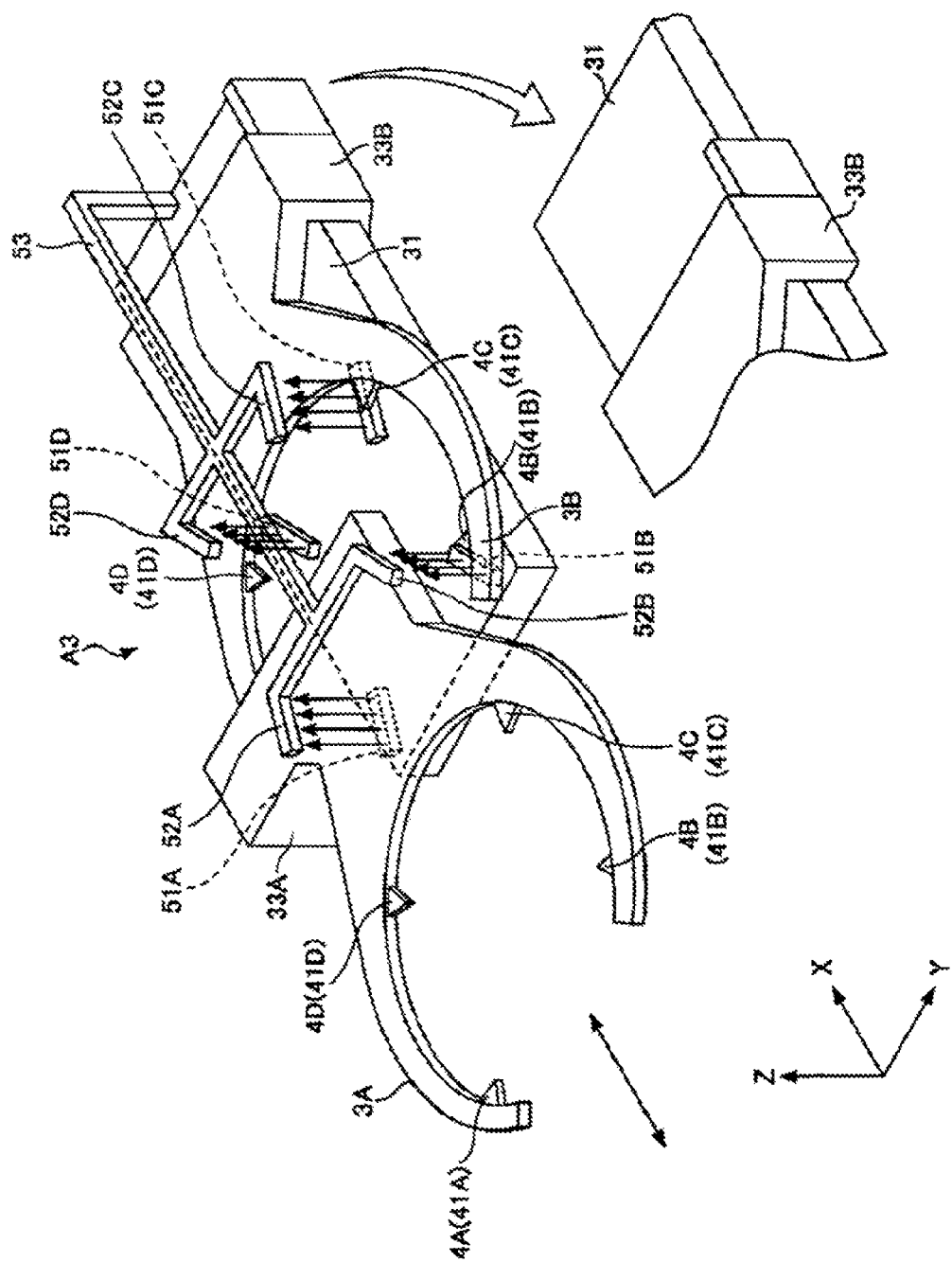
FIG. 7 is a perspective view of a carrying arm included in the third block shown in FIG. 4.

Referring to FIG. 7, the carrying arm A3 has two forks 3A and 3B, a base 31, a turning mechanism 32 (FIG. 4), horizontal drive mechanisms 33A and 33B and an elevator table 34 (FIG. 4). Detecting units 5A, 5B, 5C and 5D (FIG. 10) is combined with the carrying arm A3. The carrying arm A3 and the detecting units 5A to 5D are controlled by a controller 6.

The fork 3A is placed above the fork 3B. The base 31 can be turned about a vertical axis by the turning mechanism 32. As shown in FIG. 7, base end parts of the forks 3A and 3B are supported on the horizontal moving mechanisms 33A and 33B, respectively. The horizontal moving mechanisms 33A and 33B are connected to a motor M (FIG. 11) by a transmission mechanism, such as a ball-screw mechanism or a timing belt mechanism. The horizontal moving mechanisms 33A and 33B advance and retract the forks 3A and 3B, respectively.

Referring again to FIG. 4, the elevator table 34 is disposed under the turning mechanism 32. The elevator table 34 can be vertically moved along straight Z-axis guide rails parallel to the Z-axis by an elevating mechanism. The elevating mechanism may be a ball-screw mechanism or a timing belt mechanism. The Z-axis guide rails and the elevating mechanism are covered with a cover 35. For example, upper parts are connected. The cover 35 can slide along a straight Y-axis guide rail 36 parallel to the Y-axis.

Figures 8A, 8B:
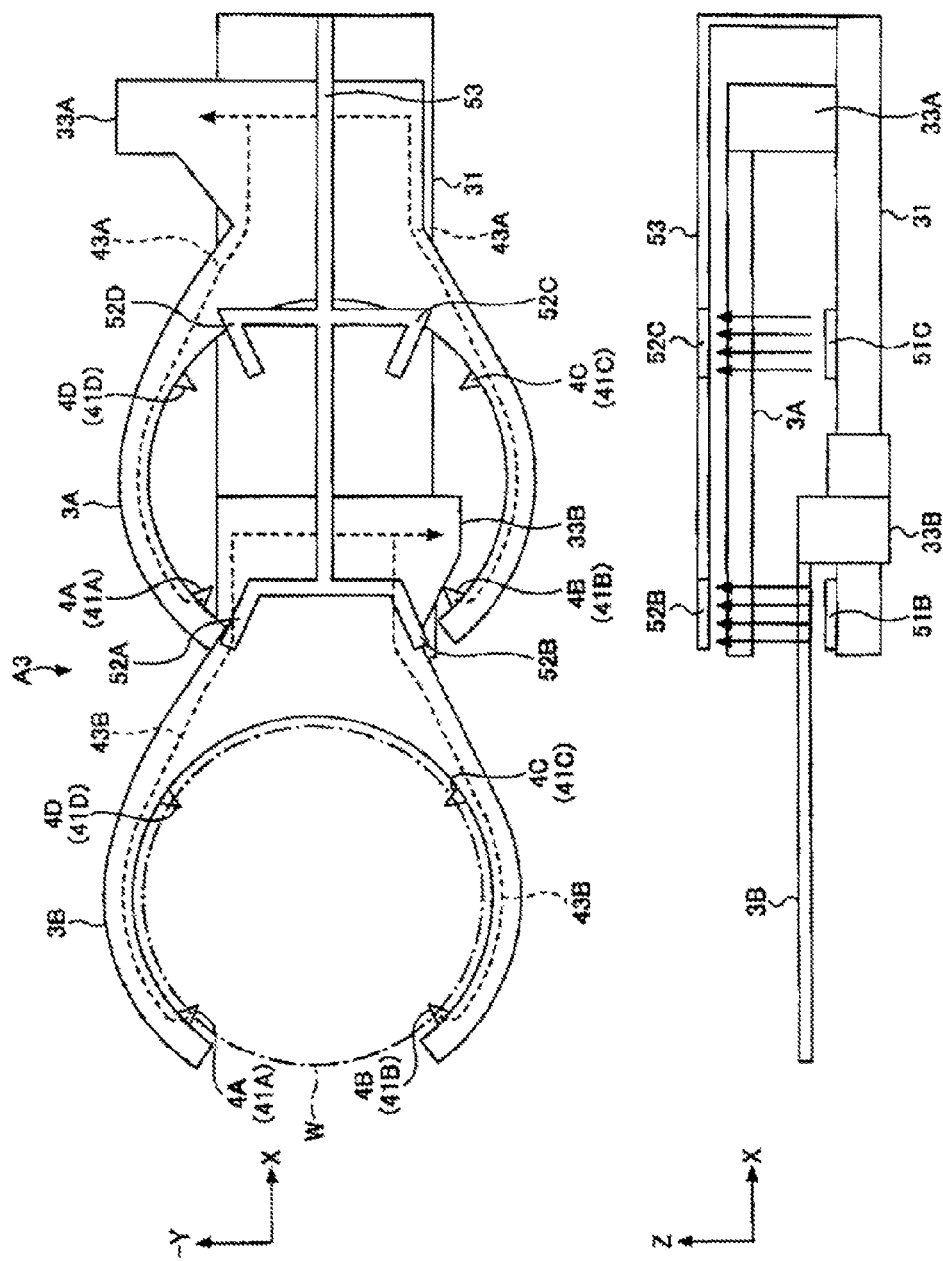
FIGS. 8A and 8B are a plan view and a side elevation, respectively, of the carrying arm shown in FIG. 7.

The forks 3A and 3B will be described with reference to FIGS. 7, 8A and 8B. Referring to FIG. 8A, each of the forks 3A and 3B has a circular front part capable of surrounding a wafer W to be carried. Each of the forks 3A and 3B is provided with four support lugs 4A, 4B, 4C and 4D. The support lugs 4A to 4D protrude inward from the inner edge of each of the forks 3A and 3B and are arranged at predetermined angular intervals. Although each of the forks 3A and 3B is provided with the four support lugs 4A to 4D in this embodiment, the fork, each of the forks 3A and 3B may be provided with three or more support lugs.

Figure 9:
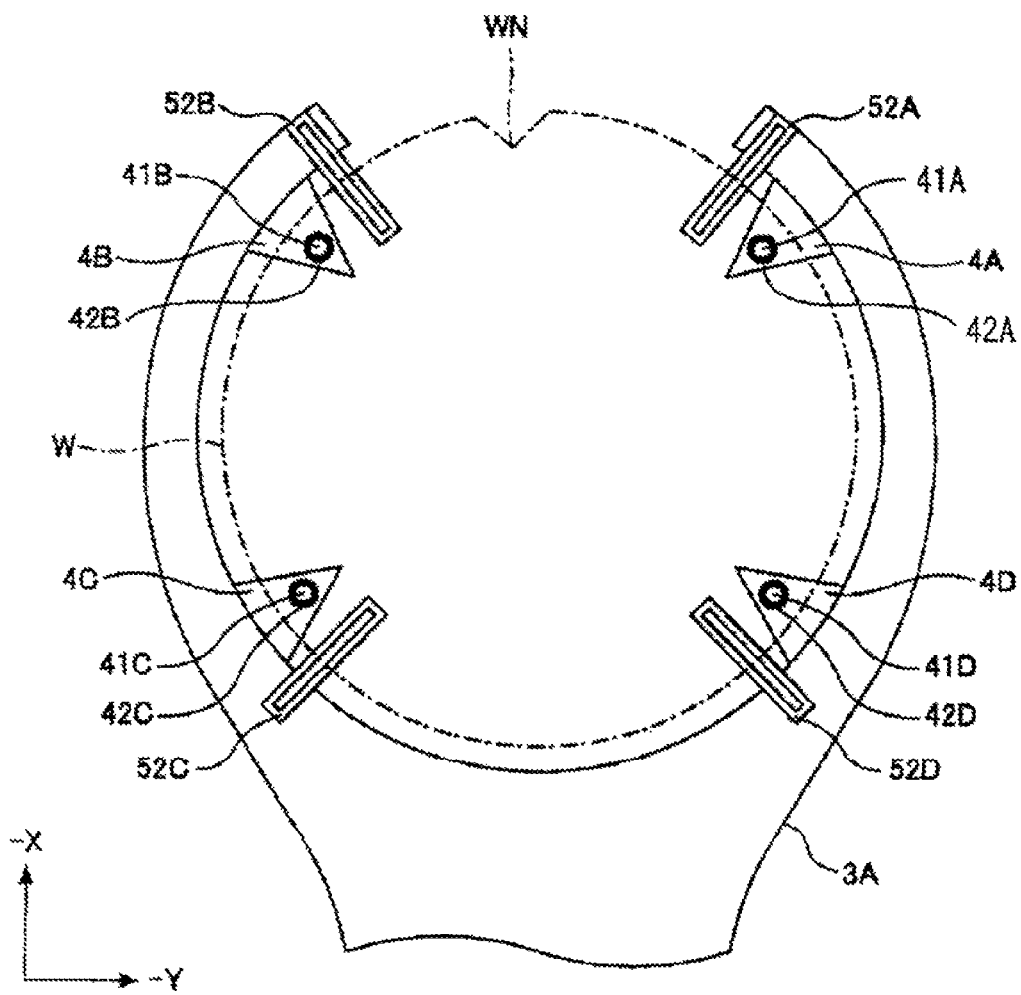
FIG. 9 is an enlarged plan view of a fork included in the carrying arm shown in FIGS. 7 and 8.

As shown in FIG. 9, the support lugs 4A to 4D of the fork 3A are provided with suction holds 41A to 41D and annular pads 42A to 42D surrounding the suction holes 41A to 41D, respectively. As shown in FIG. 8A, the suction holes 41A to 41D communicate with vacuum conduits 43A formed in the fork 3A or on the upper or lower surface of the fork 3A. The vacuum conduits 43A are connected to a vacuum exhauster, not shown. Similarly, the support lugs 4A to 4D of the fork 3B are provided with suction holes 41A to 41D and annular pads 42A to 42D, respectively. As shown in FIG. 8A, the suction holes 41A to 41D communicate with vacuum conduits 43B formed in the fork 3B or on the upper or lower surface of the fork 3B. The vacuum conduits 43B are connected to the vacuum exhauster. Thus, a vacuum chucking mechanism is formed in each of the forks 3A and 3B. When a wafer W is supported on the annular pads 42A to 42D of the support lugs 4A to 4D, the wafer W can be firmly held on the fork 3A (or 3B) by suction exerted thereon through the vacuum conduits 43A (or 43B) by the vacuum exhauster.

Preferably, the annular pads 42A to 42D are made of an elastic material, such as rubber, to ensure close contact between the annular pads 42A to 42D and the edge of the wafer W.

Position Measuring Units Combined with Forks of Carrying Arm

Position measuring units for measuring the position of a wafer W held on the fork 3A (or 3B) will be described. Referring to FIG. 7, a support member 53 rising from the base 31 and horizontally extending above the base 31 is attached to the base 31. The support member 53 has four arms provided with sensors 52A, 52B, 52C and 52D, respectively. The sensors 52A to 52D are positioned above the forks 3A and 3B retraced to the base end. More specifically, the sensors 52A to 52D are arranged along the edge of a wafer held by the fork 3A (or 3B) at predetermined angular intervals as viewed from above as shown in FIG. 9. The sensors 52A to 52D extend across the edge of the wafer W. In this embodiment, the sensors 52A to 52D are linear CCD sensors.

In the following description, the position of the fork 3A (or 3B) at the base end is called a home position in some cases.

Referring to FIG. 7, light sources 51A 51B, 51C and 51D are placed on the base 31. The light sources 51A to 51D are arranged so as to correspond to the sensors 52A to 52D, respectively. Each of the light sources 51A to 51D is formed by linearly arranging light-emitting diodes (LEDs). The light sources 51A to 51D and the sensors 52A to 52D respectively corresponding to the light sources 51A to 51D form measuring devices, respectively.

The light sources 51A to 51D may be placed on the support member 53 and the sensors 52A to 52D may be placed on the base 31. The light sources 51A to 51D (or the sensors 52A to 52D) may be placed on a suitable support member instead of placing on the base 31, provided that the fork 3A (or 3B) and a wafer W held by the fork 3A (or 3B) can cross spaces in the detecting units 5A to 5D.

Figure 10:
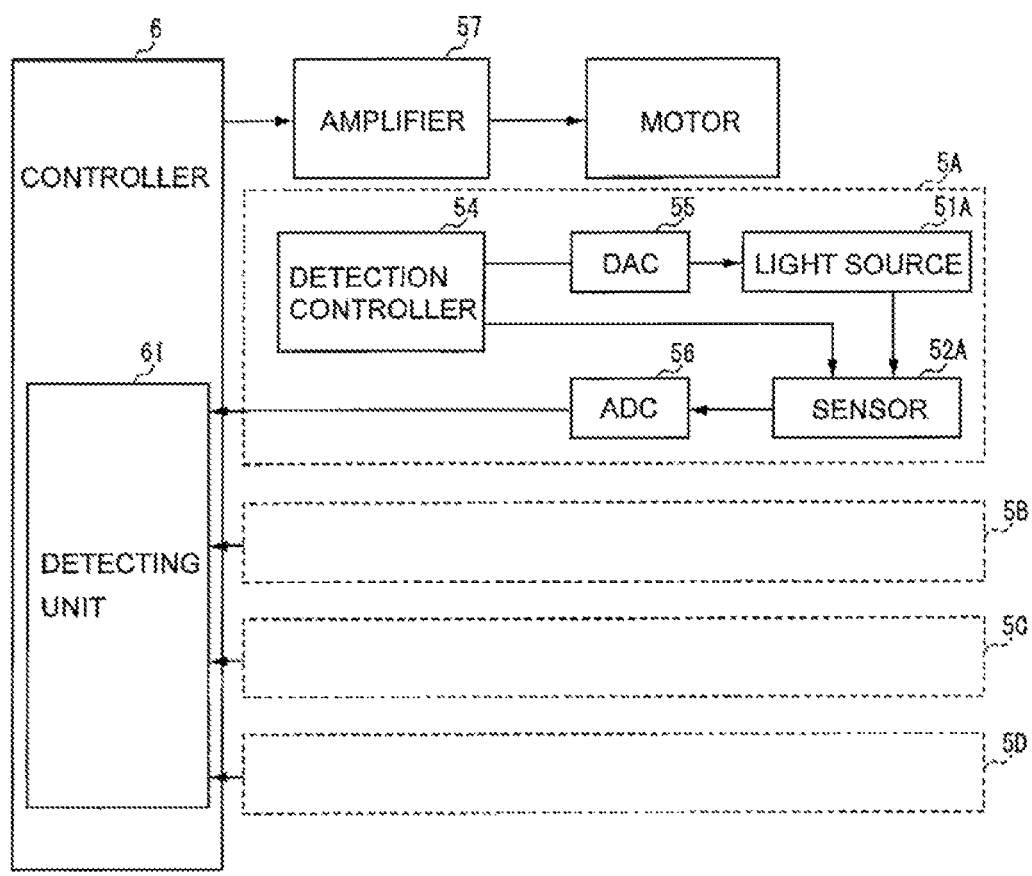
FIG. 10 is a block diagram of a control unit included in the coating and developing system shown in FIGS. 1 to 3.

As shown in FIG. 10, the detecting unit 5A includes the light source 51A, the sensor 52A, a detection controller 54, a digital-to-analog converter (DAC) 55 and an analog-to-digital converter (ADC) 56. Although not shown in FIG. 10, the detecting units 5B, 5C and 5D include the light sources 51B, 51C and 51D and the sensors 52B, 52C and 52D, respectively, and have the same configuration as the detecting unit 5A.

The detection controller 54 is a timing signal generator that generates a signal to transfer charge by timing delayed operations of the component CCDs of the sensor 52A, i.e., a linear CCD sensor, on the basis of a clock signal generated by a clock, not shown. The detection controller 54 also control current supplied to the light source 51A including the LEDs. The DAC 55 converts a digital control signal provided by the detection controller 54 into an analog signal and gives the analog signal to the light source 51A. The ADC 56 converts an analog detection signal provided by the sensor 52A into a digital detection signal.

A detection signal provided by the ADC 56 of the detecting unit 5A and conveying a measurement is given to an arithmetic unit 61 included in the controller 6. The controller 6 sends control signals through an amplifier 57 to control an X-axis drive motor for driving the horizontal moving mechanisms 33A and 33B, a Y-axis drive motor for driving the base 31, a Z-axis drive motor for driving the elevator table 34, and a drive motor for driving the turning mechanism 32.

A control signal provided by the detection controller 54 is converted into an analog control signal by the DAC 55. When the analog control signal is given to the light source 51A, the light source emits a band of light. The light emitted by the light source 51A is received by the sensor 52A. Then, the sensor 52A provides a detection signal indicating the amount of received light at time specified by a control signal provided by the detection controller 54. The detection signal provided by the sensor 52A and conveying a measurement is converted into a digital signal by the ADC 56 and the digital signal is given to the arithmetic unit 61 of the controller 6.

The controller 6 controls not only the detecting units 5A to 5D but also the operation of the carrying arm. Operations of the controller for controlling transfer of a wafer W among the modules will be described with reference to FIG. 11.

Figure 11:
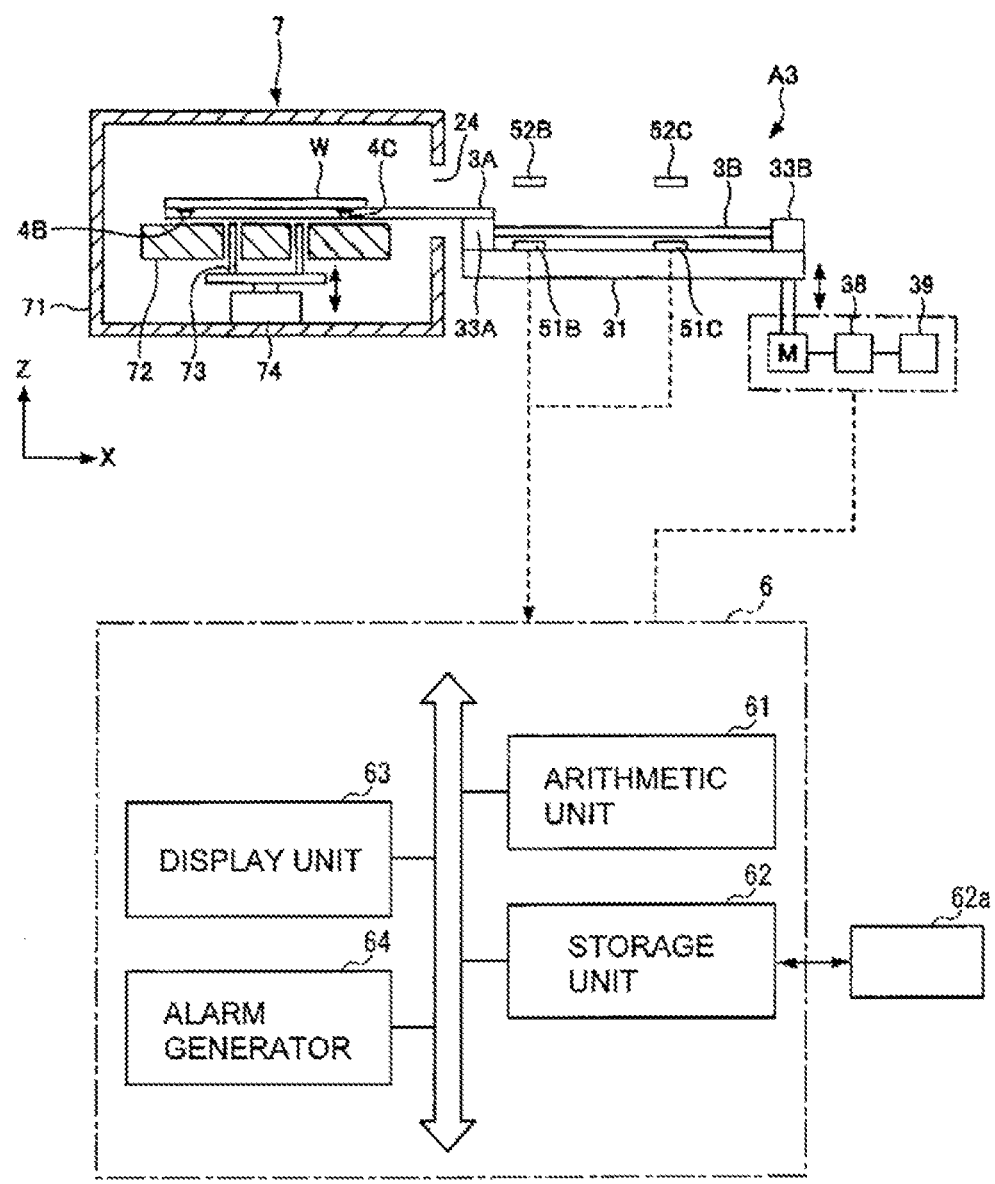
FIG. 11 is a view of assistance in explaining the relation between the control unit shown in FIG. 10 and the heating module and the carrying arm shown in FIGS. 6 and 7.

Referring to FIG. 11, the fork 3A of the carrying arm A3 is advanced into a cooling module 7. The cooling module 7 is, for example, one of the thermal modules TM shown in FIG. 4. The cooling module 7 has a processing vessel 71, a support table 72, lifting pins 73 and a raising mechanism 74. The support table 72 is provided with a conduit, not shown, through which a temperature-regulated fluid flows to cool a wafer W at a predetermined temperature. Lifting pins 73 can be moved vertically through through holes formed in the support table 72. The lifting pins 73 are moved vertically by the raising mechanism 74.

The controller 6 has the arithmetic unit 61, a storage unit 62, a display unit 63 and an alarm generator 64. The arithmetic unit has, for example, a storage device and a CPU (central processing unit). The arithmetic unit 61 reads a program stored in the storage unit 62, sends control signals to the motors M of the carrying arm A3 according to instructions included in the program to execute operations for transferring and carrying the wafer W. The arithmetic unit 61 reads a program stored in the storage unit 62 and sends control signals indicating instructions included in the program to the component units of the coating and developing system 100 to execute necessary processes.

The storage unit 62 reads a program including instructions to be executed by the arithmetic unit 61 from a computer-readable storage medium 62a storing programs. The programs include a program including instructions to be executed by the coating and developing system 100 and the components of the coating and developing system 100 to carry out a substrate holder positioning method, which will be described later. The recording medium 62a may be, for example, a flexible disk, a compact disk, a hard disk or a magnetooptical disk (MO disk).

The display unit 63 includes a display including, for example, a liquid crystal display panel (LCD panel). Operations for selecting various substrate processing programs and entering parameters specifying conditions for substrate processing operations can be achieved by operating the display unit 63.

The alarm generator 64 generates alarm signals when the components of the coating and developing system 100 including the carrying arm A3 malfunction.

The arithmetic unit 61 sends control signals to the motors of the horizontal drive mechanisms 33A and 33B of the carrying arm A3, the base 31, the elevator table 34 and the turning mechanism 32, am encoder 38 and pulse counter 39 that counts pulses to control operations of those components. The storage unit 62 stores a program including instructions for carrying out a substrate holder positioning method according to the present invention.

Positioning Method of Positioning Carrying Arm with Respect to Z-Axis

A substrate holder positioning method embodying the present invention for positioning a substrate holder included in a substrate carrying mechanism will be described as applied to the carrying arm A3 shown in FIGS. 4 and 7 and the coating module 23. Preferably, this positioning method (or other positioning methods which will be described later) is executed immediately after, for example, the coating and developing system 100 shown in FIG. 1 has been started. The positioning method may be executed prior to starting the coating and developing system 100 when the coating and developing system 100 has been kept in an idle state for a time longer than a predetermined time. The positioning method does not use a test wafer provided with sensors and such and uses, for example, a bare wafer or a reclaimed wafer.

Figure 12A:
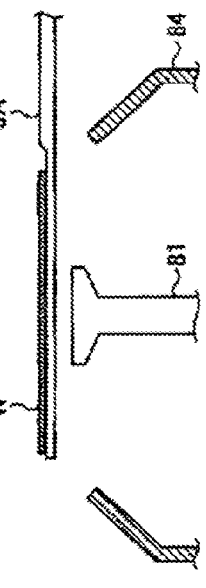
FIGS. 12A, 12B, 12C, 12D, 12E and 12F are views of assistance in explaining a substrate holder positioning method in a first embodiment of the present invention.
Figure 12B:
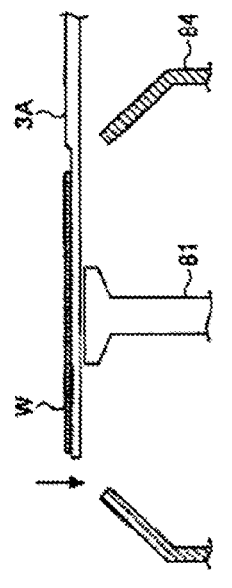
Figure 12C:
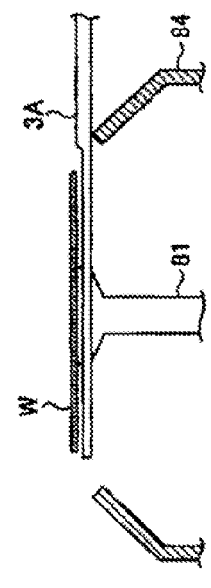

FIGS. 12A to 12C illustrates steps of a first positioning method for positioning a fork 3A included in the carrying arm A3 with respect to the Z-axis. As shown in FIG. 12A, the spin chuck 81 of the coating module 23 is raised to a wafer receiving position by the drive unit 82 (FIG. 5). In this state, the fork 3A holding a wafer W is raised to a level higher than the spin chuck 81, is advanced though the gate 80a into the box 80 (FIG. 5) and holds the wafer above the spin chuck 81.

As shown in FIG. 12B, the fork 3A is lowered by, for example, 0.1 mm and the vacuum mechanism connected to the fork 3A is operated temporarily. If the wafer W is attracted to the fork 3A, the sucking operation of the vacuum mechanism is stopped, and then, the fork 3A is lowered further by, for example, 0.1 mm.

This procedure is repeated to transfer the wafer W to the spin chuck 81 and the back surface of the wafer W is separated from the fork 3A as illustrated in an exaggerated view in FIG. 12C. The wafer W will not be attracted to the fork 3A even if the vacuum mechanism is operated after the wafer W has been transferred to the spin chuck 81. The position of the fork 3A with respect to the Z-axis, namely, the height, in this state is a reference position with respect to the Z-axis. Positioning operations are ended after storing this position as a new reference position with respect to the Z-axis.

After the reference position with respect to the Z-axis has been thus determined, the fork 3A carries a wafer W into the box 80 to a position lower than the new reference position by a predetermined distance, holds the wafer W above the spin chuck 81 when the spin chuck 81 is at a wafer rotating position in the cup, and then, the spin chuck 81 is raised to transfer the wafer W from the fork 3A to the spin chuck 81.

Whether or not the wafer W is attracted to the fork 3A can be determined by a vacuum sensor or a vacuum gage placed in a pipe connecting the vacuum conduits 43B (FIGS. 8 and 9) communicating with the suction holes 41A to 41D, and the vacuum exhauster, not shown.

Figure 12D:
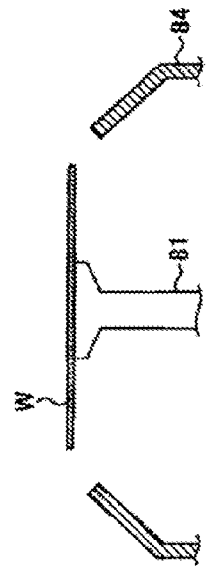
Figure 12E:
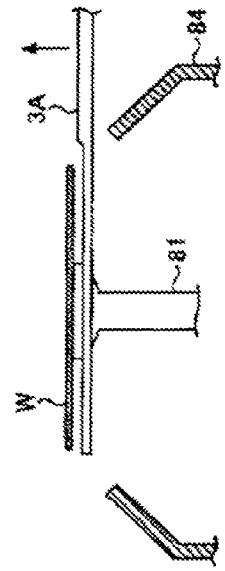
Figure 12F:
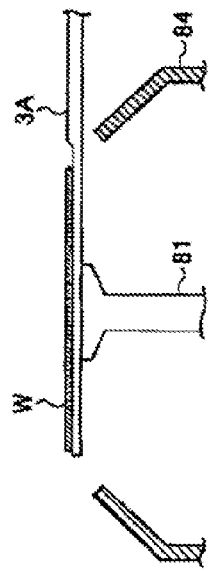

FIGS. 12D to 12F illustrate steps of a second positioning method of positioning the fork 3A of the carrying arm A3 with respect to the Z-axis. The second positioning method determines a reference position while the fork 3A is being raised. As shown in FIG. 12D, a wafer W is placed on the spin chuck 81. Then, as shown in FIG. 12E, the fork 3A is inserted under the wafer W. Then, the fork 3A is raised by, for example, 0.1 mm and the vacuum mechanism is actuated. If a gap is formed between the wafer W and the spin chuck 81 as shown in FIG. 12E, the wafer W is not attracted to the fork 3*a*. As shown in FIG. 12F, the wafer W is seated on the fork 3A by repeating the operations for raising and stopping the fork 3A and applying suction to the wafer W. In this state, the wafer W is attracted to the fork 3A when the vacuum mechanism is actuated. Thus, a reference position with respect to the Z-axis of the fork 3A in the coating module 23 is determined. Positioning operations are ended after storing this reference position as a new reference position with respect to the Z-axis.

The positioning method of positioning the fork 3A with respect to the Z-axis mentioned above does not need any positioning jig and can simply determine the reference position at a low cost. Positioning in necessary accuracy can be achieved by properly adjusting the increment or decrement in the height of the fork 3A.

Fork Positioning Method (1) of Positioning Fork with Respect to the X- and the Y-Direction A fork positioning method (1) of positioning the fork 3A with respect to the X- and the Y-direction respectively parallel to the X- and the Y-axis in the coating module 23 will be described. In reference drawings, sensors and such on the fork 3A are omitted to simplify illustration.

Figure 13A:
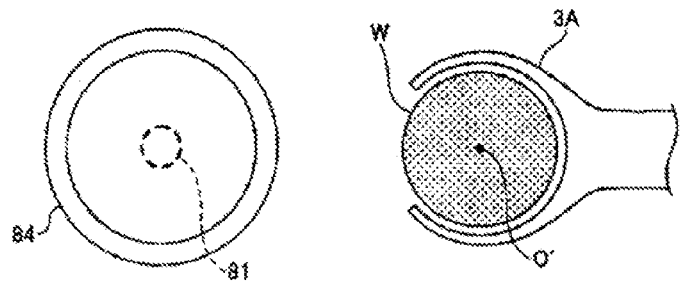
FIGS. 13A, 13B, 13C and 13D are views of assistance in explaining a substrate holder positioning method in a second embodiment of the present invention.

When a wafer W is held by the fork 3A at a position in front of the coating module 23 as shown in FIG. 13A, the position o' of the center of the wafer W is measured. First, the controller 6 and the detecting unit 5A (FIG. 10) measure the position of the edge of the wafer W. More concretely, the light sources 51A to 51D (FIG. 7) disposed below the fork 3A emit light upward. The sensors 52A to 52D disposed above the fork 3A receive the light emitted by the light sources 51A to 51D. When the sensors 52A to 52D are linear CCD sensors each provided with CCDs arranged parallel to a diameter of the wafer W, the positions of the boundaries between the CCDs that received the light and those not received the light can be determined on the basis of values measured by the CCDs. The position of the edge of the wafer W can be measured on the basis of the boundaries.

Figure 14:
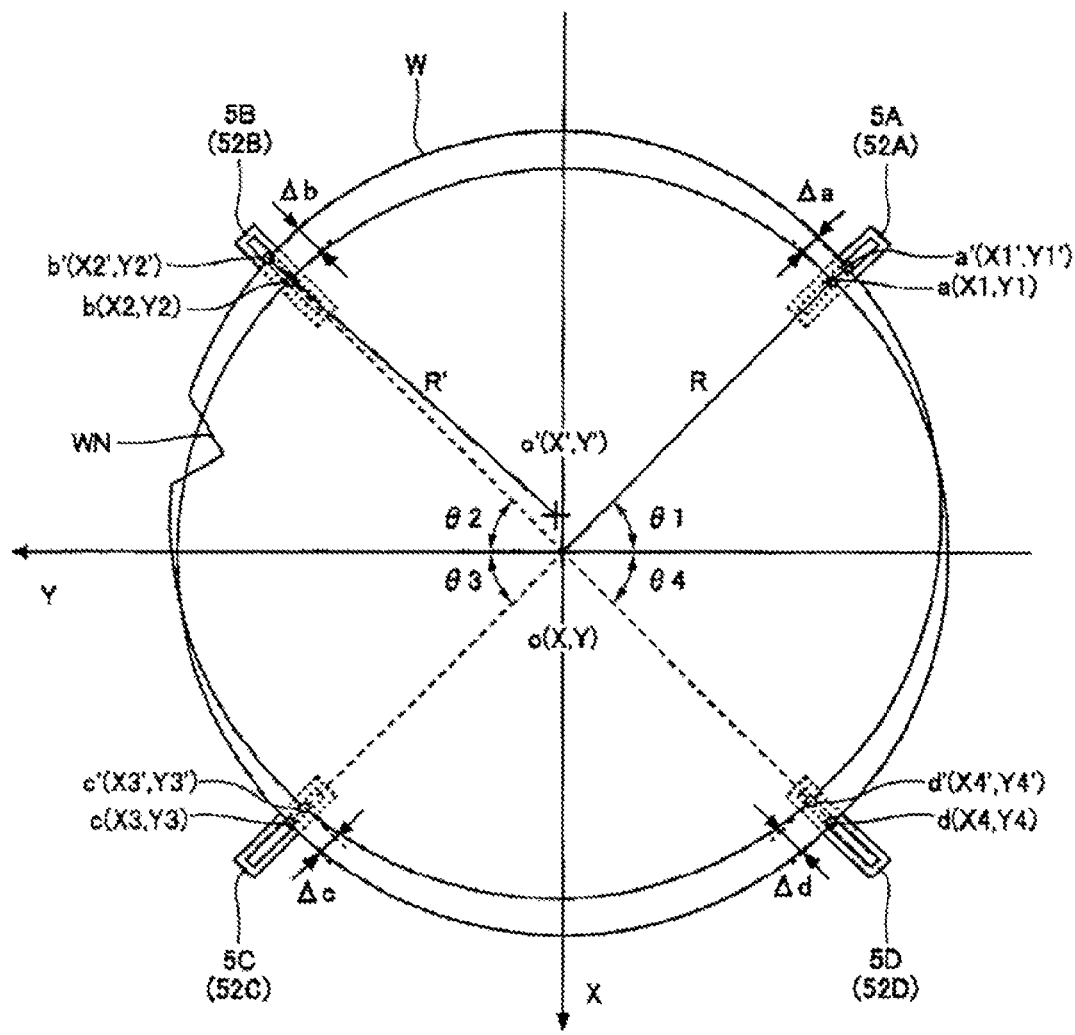
FIG. 14 is a views of assistance in explaining a substrate position measuring method included in the substrate holder positioning method in the second embodiment.

Referring to FIG. 14, suppose that angles between directions in which the four sensors 52A to 52D extend, respectively, and the Y-axis are θ1, θ2, θ3 and θ4, points a, b, c and d respectively on the sensors 52A to 52D correspond to the edge of a wafer W held at a correct position, namely, a position not dislocated, on the fork 3A and points a', b', c' and d' respectively on the sensors 52A to 52D correspond to the edge of the wafer W at an actual position on the fork 3A.

Suppose that distances between the points a and a', between the points b and b', between the points c and c', and between the points d and d' on the sensors 52A to 52D, respectively, are Δa, Δb, Δc and Δd. Then, the distances Δa, Δb, Δc and Δd are expressed by Expressions (1) to (4).

$$\Delta a \text{ (mm)} = \{(\text{Number of pixels between the inner end of } 52A \text{ and the point } a') - (\text{Number of pixels between the inner end of } 52A \text{ and the point } a)\} \times \text{Pixel interval (mm)} \quad (1)$$

$$\Delta b \text{ (mm)} = \{(\text{Number of pixels between the inner end of } 52B \text{ and the point } b') - (\text{Number of pixels between the inner end of } 52B \text{ and the point } b)\} \times \text{Pixel interval (mm)} \quad (2)$$

$$\Delta c \text{ (mm)} = \{(\text{Number of pixels between the inner end of } 52C \text{ and the point } c') - (\text{Number of pixels between the inner end of } 52C \text{ and the point } c)\} \times \text{Pixel interval (mm)} \quad (3)$$

$$\Delta d \text{ (mm)} = \{(\text{Number of pixels between the inner end of } 52D \text{ and the point } d') - (\text{Number of pixels between the inner end of } 52D \text{ and the point } d)\} \times \text{Pixel interval (mm)} \quad (4)$$

Coordinates of the points a to d and the points a' to d' are expressed by Expressions (5) to (12).

$$\text{The point } a \; (X1, Y1) = (X - R\sin\theta 1, Y - R\cos\theta 1) \quad (5)$$

$$\text{The point } a' \; (X1', Y1') = (X1 - \Delta a\sin\theta 1, Y1 - \Delta a\cos\theta 1) \quad (6)$$
$$= (X - (R + \Delta a)\sin\theta 1, Y - (R + \Delta a)\cos\theta 1)$$

$$\text{The point } b \; (X2, Y2) = (X - R\sin\theta 2, Y + R\cos\theta 2) \quad (7)$$

$$\text{The point } b' \; (X2', Y2') = (X2 - \Delta b\sin\theta 2, Y2 + \Delta b\cos\theta 2) \quad (8)$$
$$= (X - (R + \Delta b)\sin\theta 2, Y + (R + \Delta b)\cos\theta 2)$$

$$\text{The point } c \; (X3, Y3) = (X + R\sin\theta 3, Y + R\cos\theta 3) \quad (9)$$

$$\text{The point } c' \; (X3', Y3') = (X3 + \Delta c\sin\theta 3, Y3 + \Delta c\cos\theta 3) \quad (10)$$
$$= (X + (R + \Delta c)\sin\theta 3, Y + (R + \Delta c)\cos\theta 3)$$

$$\text{The point } d \; (X4, Y4) = (X + R\sin\theta 4, Y - R\cos\theta 4) \quad (11)$$

$$\text{The point } d' \; (X4', Y4') = (X4 + \Delta d\sin\theta 4, Y4 - \Delta d\cos\theta 4) \quad (12)$$
$$= (X + (R + \Delta d)\sin\theta 4, Y - (R + \Delta d)\cos\theta 4)$$

The coordinates a'(X1', Y1'), b'(X2', Y2'), c'(X3', Y3') and d'(X4', Y4') are calculated by using Expressions (6), (8), (10) and (12), respectively.

In Expressions (5) to (12), X and Y are the abscissa and the ordinate, respectively, of the position o of the center of the wafer W at the correct position. The coordinates (X, Y) of the position o of the center of the wafer W may be determined by positioning the wafer previously at the correct position and measuring the position o of the center or may be determined on the basis of the position of the inner edge of the fork 3A.

The coordinates (X', Y') of the position o' of the center of the wafer W at the actual position are calculated by using the coordinates of any three of the four points a', b', c' and d'. For example, the coordinates (X', Y') of the position o' of the center of the wafer W at the actual position are calculated by using the coordinates a'(X1', Y1'), b'(X2', Y2') and c'(X3', Y3') and Expressions (13) and (14)

Expression (13)

$$X' = \frac{X1'^2(Y3' - Y2') + X2'^2(Y1' - Y3') + X3'^2(Y2' - Y1') - (Y1' - Y3')(Y3' - Y2')(Y2' - Y1')}{2\{X1'(Y3' - Y2') + X2'(Y1' - Y3') + X3'(Y2' - Y1')\}} \quad (13)$$

Expression (14)

$$Y' = \frac{Y1'^2(X2' - X3') + Y2'^2(X3' - X1') + Y3'^2(X1' - X2') - (X2' - X3')(X3' - X1')(X1' - X2')}{2\{Y1'(X2' - X3') + Y2'(X3' - X1') + Y3'(X1' - X2')\}} \quad (14)$$

Radius R' can be calculated by using the coordinates o'(X', Y'), a'(X1', Y1'), b'(X2', Y2') and c'(X3', Y3') and Expression (15).

Expression (15)

$$R' = \sqrt{\{(X' - X1')^2 + (Y' - Y1')^2\}} \quad (15)$$

The coordinates (X', Y') of the position o' of the center and the radius R' are calculated by using the coordinates of a set of the three points other than the set of the points a', b' and c', such as a set of the points a', b' and d', a set of the points a', c' and d' or a set of the points b', d' and d', and Expressions (13) to (15). The radius R' is used for determining whether or not any one of the sensors 52A to 52D detected a notch WN formed in the edge of the wafer W. More specifically, it is decided whether or not the radius R' calculated by using the coordinates of a set of any three of the four points is approximately equal to the known radius R of the wafer W. If the notch WN of the wafer W is near none of the points a', b', c' and d' in a plane as shown in FIG. 14, the radius R' calculated by using a set of any three of the points a', b', c' and d' is approximately equal to the radius R. In such a case, it is decided that none of the four sensors 52A to 52D has detected the notch WN of the wafer W.

Figure 15:
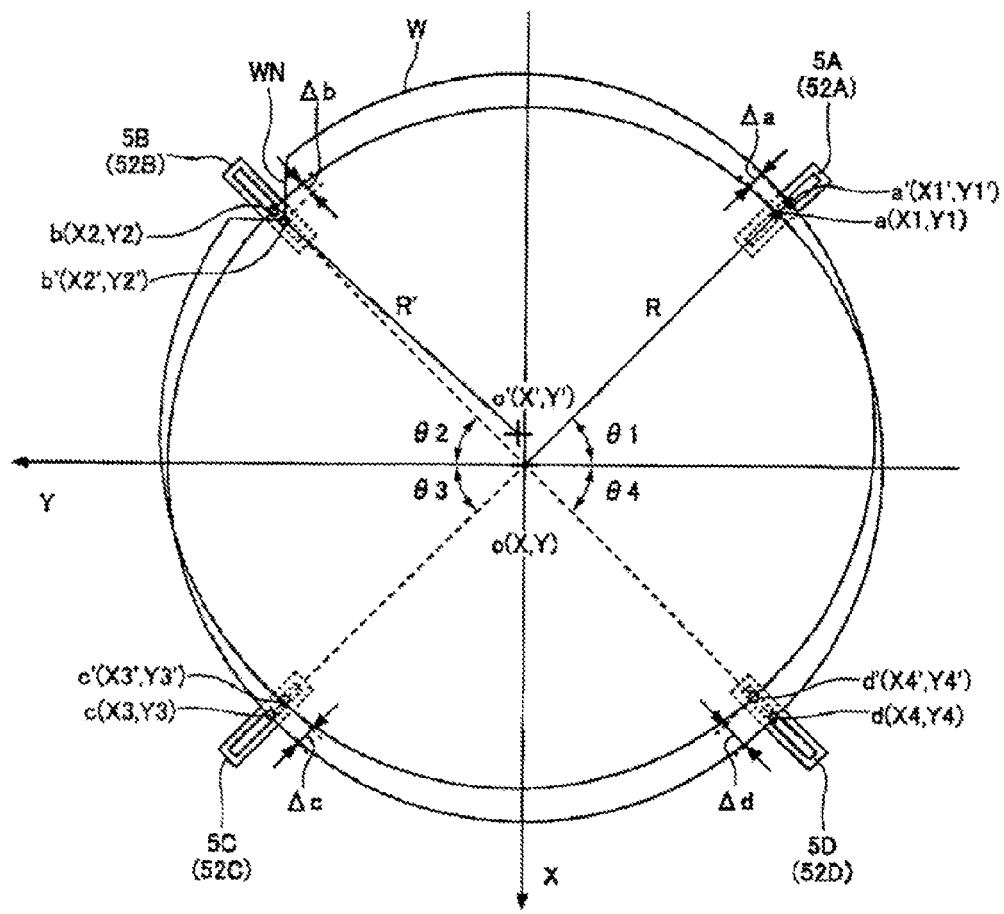
FIG. 15 is a views of assistance in explaining another substrate position measuring method included in the substrate holder positioning method in the second embodiment.

If the notch WN of the wafer W is near the point b' in a plane as shown in FIG. 15 by way of example, a radius R' calculated by using a set of the three points excluding the point b' is approximately equal to the radius R and a radius R' calculated by using a set of the three points including the point b' is shorter than the radius R. In such a case, it is decided that the sensor 52B among the four sensors 52A to 52D has detected the notch WN of the wafer W.

Then, measurements measured by the three sensors not detected the notch WN among the four sensors 52A to 52D are selected. If none of the sensors 52A to 52D has detected the notch WN of the wafer W as shown in FIG. 14, measurements measured by any three of the sensors 52A to 52D may be selected. In the case shown in FIG. 15, measurements measured by the three sensors 52A, 52C and 52D, i.e., the three sensors among the four sensors 52A to 52D excluding the sensor 52B are selected.

Then, the coordinates (X', Y') of the position o' of the center of the wafer W is calculated by using the measurements measured by the three selected sensors. The coordinates (X', Y') are stored in, for example, the storage unit 62. The point designated by the coordinates (X', Y') is on an X-Y coordinate system having its origin at the position o of the center; that is, the position o' of the center of the wafer W designated by the coordinates (X', Y') is a position relative to the fork 3A.

Figure 13B:
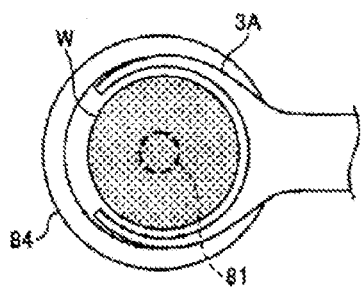

The fork 3A carries the wafer W to a position above the spin chuck 81 as shown in FIG. 13B and the spin chuck 81 is raised to receive the wafer W from the fork 3A. In this state, the wafer W is at a level higher than that of the fork 3A. Although the fork 3A is kept stationary at the level lower than that of the wafer W in the case shown in FIG. 13B, the fork 3A may be withdrawn through a position above the cup 84.

Subsequently, the spin chuck 81 is turned through 180°, and then the spin chuck 81 is lowered to transfer the wafer W to the fork 3A as shown in FIG. 18C. Then, the fork 3A received the wafer W is withdrawn from the coating module 23. The coordinates (X", Y") of the position o" of the center of the wafer W at a position in front of the coating module 23 is determined by the procedure mentioned above.

The stored coordinates (X', Y') of the position o' of the center of the wafer W and the coordinates (X", Y") of the position o" of the center of the wafer W are determined before the spin chuck 81 supporting the wafer W is turned through 180° and after the spin chuck 81 supporting the wafer W has been turned through 180°, respectively. Therefore, the middle point between points designated by those coordinates corresponds to the center O of rotation of the spin chuck 81. Therefore, the coordinates (Xc, Yc) of the center O of rotation of the spin chuck 81 is expressed by the following expression.

$$(Xc, Yc) = (|X'-X''|/2, |Y'-Y''|/2)$$

The fork 3A is moved to a position where the center of the wafer W held at the correct position on the fork 3A coincides with the position designated by the coordinate (Xc, Yc). The positioning operations for positioning the fork 3A in the coating module 23 is completed after setting this position as a reference position of the fork 3A with respect to directions respectively parallel to the X-axis and the Y-axis.

The foregoing fork positioning method (1) can determine the center of rotation of the spin chuck 81 by measuring the positions of the center of the wafer W before and after the wafer W is turned through 180° by the spin chuck 81 by using measurements obtained through the cooperative work of the light sources 51A to 51D placed on the base 31 and the sensors 52A to 52D held on the support member 53. The reference position of the fork 3A can be determined on the basis of the center of rotation of the spin chuck 81. Since any positioning jig is not necessary, the fork positioning method (1) can simply achieve determining the center of rotation at a low cost.

The wafer W may be turned through, for example, 90° instead of 180°. The angle through which the wafer W is turned may be any angle other than 360°.

The position o' of the center of the wafer W and the position o" of the center of the wafer W after being turned through 180° are designated on the X-Y coordinate system by the coordinates (X', Y') and (X", Y"), respectively, and the center of rotation of the spin chuck 81 is at the middle point between the points respectively designated by the coordinates (X', Y') and (X", Y"). Therefore, operations for positioning the wafer W relative to the fork 3A are not necessary. Even if the wafer W is dislocated from the correct position on the fork 3A before executing the fork positioning method (1), this fork positioning method (1) can be executed; that is, the fork 3A can be positioned without positioning the wafer W relative to the fork 3A.

There is a range in which the fork positioning method (1) is possible. The fork positioning method (1) is possible on condition that the fork A3 of the carrying arm A3 is in that range before starting the fork positioning method (1). The detecting method of determining the position of the center of the wafer W can decide whether or not the fork 3A is in the range. Preferably, a warning is issued when the fork 3A is outside the range.

Fork Positioning Method (2) of Positioning Fork with Respect to the X- and the Y-Direction A fork positioning method (2) of positioning the fork 3A with respect to the X- and the Y-direction will be described in connection with the fork 3A and the thermal module TM shown in FIGS. 4 and 6. In the reference drawing referred to in the following description, the sensors and such on the fork 3A are omitted for convenience.

Figures 16A, 16B, 16C:
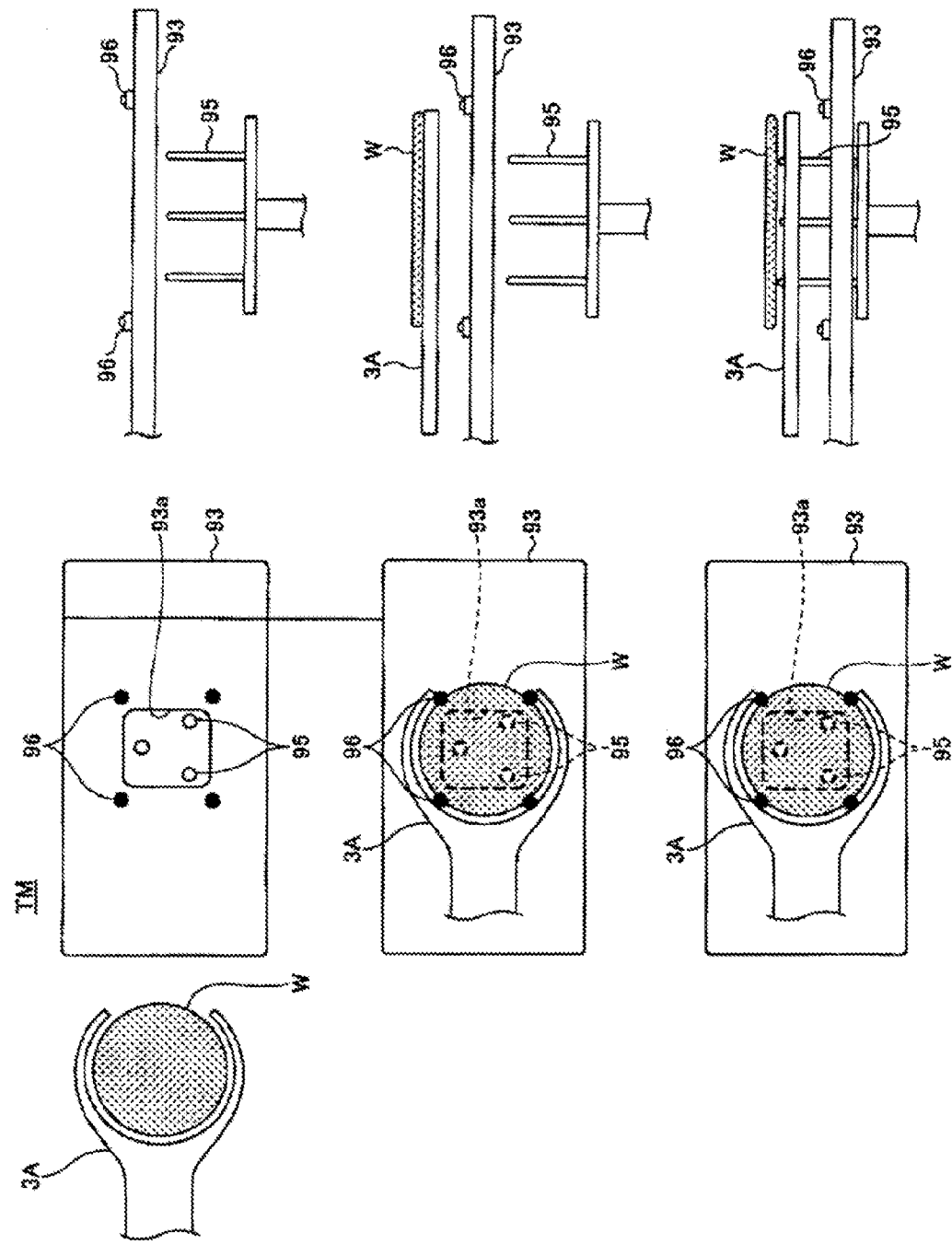
FIGS. 16A, 16B and 16C are views of assistance in explaining a substrate position measuring method included in a substrate holder positioning method in a third embodiment of the present invention.

FIGS. 16 to 18 are views of assistance in explaining the fork positioning method (2) of positioning the fork 3A with respect to the X- and the Y-direction. In FIG. 16A, a left and a middle picture are plan views illustrating the positional relation between the fork 3A, the support plate 93 and the associated parts of the thermal module TM, and a right picture is a side elevation of the support plate 93 and the associated parts shown by the middle picture. FIGS. 16B to 18I are pictures similar to those shown in FIG. 16 and showing the same parts.

The fork 3A holding a wafer W is disposed in front of the thermal module TM as shown in FIG. 16A. In this state, the cooling plate 92 shown in FIG. 6 is disposed above the heating plate 91. The cooling plate 92 is kept at that position until positioning is completed. The lifting pins 95 are at a low position below the support plate 93.

The fork 3A is moved to a position above the support plate 93 to hold the wafer W above the four wafer support pads 96 as shown in FIG. 16B. Then, the lifting pins 95 are raised through the opening 93a of the support plate 93 to receive the wafer W from the fork 3A as shown in FIG. 16C.

Figure 17D:
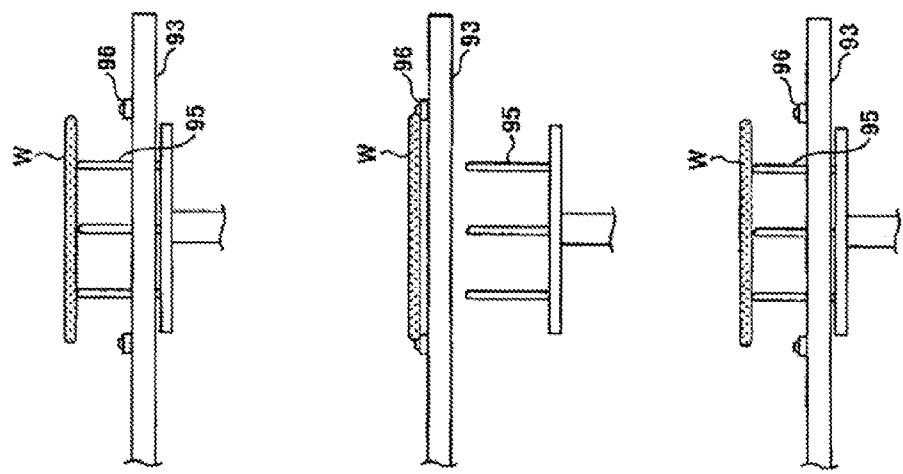
FIGS. 17D, 17E and 17F are views of assistance in explaining steps subsequent to those shown in FIGS. 16A to 16C of the substrate position measuring method included in the substrate holder positioning method in the third embodiment.
Figure 17D:
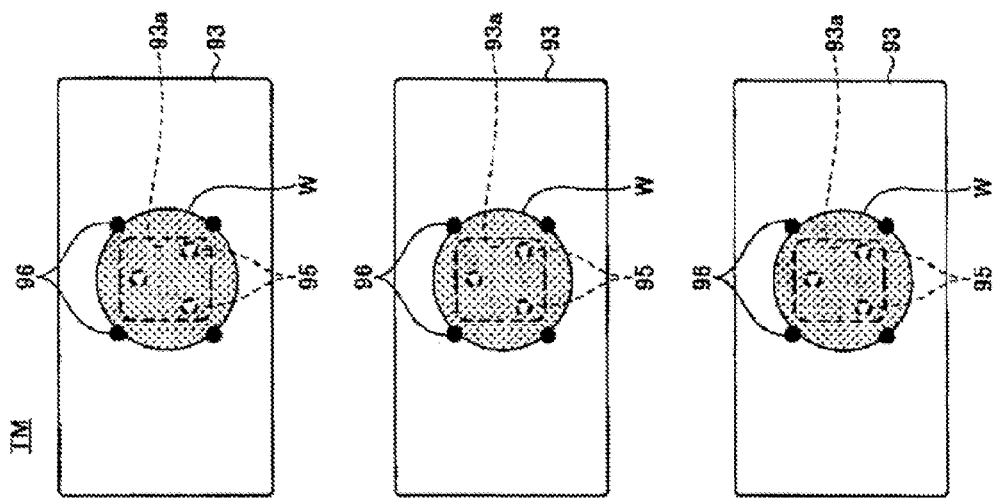
Figure 17D:
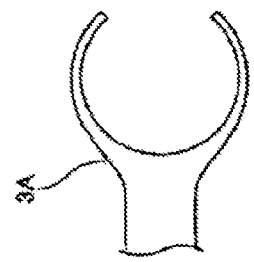
Figure 17E:
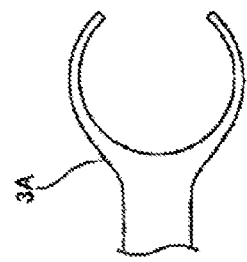

Then, as shown in FIG. 17D, the fork 3A is withdrawn from the thermal module TM. When the lifting pins 95 are lowered, the wafer W is transferred to the four wafer support pads 96 on the support plate 93 as shown in FIG. 17E. The position of the wafer is adjusted by the lower ends of the upper parts 96b of the wafer support pads 96 and the upper surfaces of the lower parts 96a of the wafer support pads 96 to position the wafer W at a correct position on the support plate 93. The correct position of the wafer W positioned by the wafer support pads 96 corresponds to the correct position of the wafer W on the heating plate 91 of the thermal module TM (FIG. 6)

Figure 17F:
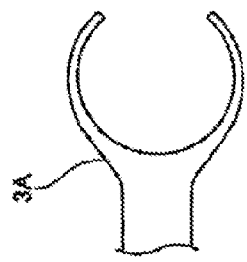

Then, the lifting pins 95 are raised again as shown in FIG. 17F, the fork 3A is moved into a space between the wafer W and the support plate 93 as shown in FIG. 18G, the lifting pins 95 are lowered to transfer the wafer W to the fork 3A as shown in FIG. 18H, and then the fork 3A is withdrawn from the thermal module TM as shown in FIG. 18I.

Subsequently, the coordinates of the position of the center of the wafer W is determined by the procedure mentioned above. Since the coordinates of the position of the center of the wafer W coincide with those of the position of the center of the wafer W positioned by the wafer support pads 96, the fork 3A is moved such that the center of the fork 3A, i.e., the center of the wafer W held at the correct position on the fork 3A, coincide with the coordinates of the center of the wafer W determined by the foregoing procedure. The positioning operations for positioning the fork 3A with respect to the X- and the Y-direction are completed after setting the position of the center as a reference position.

The fork positioning method (2) of positioning the fork 3A with respect to the X- and the Y-direction described above positions the wafer W by the four wafer support pads 96 included in the thermal module TM to find the correct position in the thermal module TM and position the fork 3A on the basis of the correct position. Since the fork positioning method (2) does not need any positioning jig, the fork positioning method (2) can simply position the fork 3A at a low cost. Since the fork positioning method (2) uses the wafer support pads capable of positioning a wafer W at a correct position, the positioning method is applicable to the modules not provided with a mechanism for turning a wafer W, such as the thermal modules TM and the transfer modules TRS. Preferably, the transfer module TRS that holds a wafer W temporarily, for example, is provided with a support plate 93 and wafer support pads 96 in addition to a wafer stage (or a wafer support or wafer support pins) intrinsic to the transfer module TRS such that the carrying arm can move to a position under the wafer stage. The support plate 93 and the wafer support pads 96 are disposed so that the position of a wafer W determined by the wafer support pads 96 corresponds to a correct position on the wafer stage.

There is a range in which the fork positioning method (1) is possible, such as a range in which a wafer W can be controlled by the wafer support pads 96. The fork positioning method (2) is possible on condition that the fork A3 of the carrying arm A3 is in that range before starting the fork positioning method (2). The detecting method of determining the position of the center of the wafer W can decide whether or not the fork 3A is in the range. Preferably, a warning is issued when the fork 3A is outside the range.

Although the preferred embodiments of the present invention have been described, the present invention is not limited to those embodiments mentioned above and various changes and modifications are possible without departing from the scope of accompanying claims.

Although the carrying arm A3 is described in connection with the foregoing embodiments, the carrying arms A1, A2 and A4, the carrying mechanism C, the carrying mechanism D and the interface arm F may be the same in construction as the carrying arm A3. The carrying arms A1, A2 and A4, the carrying mechanism C, the carrying mechanism D and the interface arm F can execute the foregoing fork positioning method. The fork positioning method is applicable to those carrying mechanisms. The module from which a wafer W is carried and the module to which a wafer W is carried may be modules each provided with a support member on which a wafer W is supported other than the foregoing modules described by way of example.

The foregoing embodiments are applicable not only to the mechanism in which the two forks 3A and 3B are arranged so as to overlap each other, but also to a carrying arm provided with two forks 3A and 3B arranged in a horizontal plane. The carrying arm may be provided with a single fork or three or more forks arranged so as to overlap each other or arranged side by side in a horizontal plane.

In the foregoing embodiments, the fork 3A or such is provided with the four light sources 51A to 51D and the four sensors 52A to 52D, taking a notch WN formed in a wafer W into consideration. When a wafer W provided with an orientation flat OF instead of a notch WN is used, three light sources and three sensors respectively corresponding to those light sources may be used, provided that the orientation flat OF is not greatly dislocated.

Electrostatic sensors may be used instead of the light sources 51A to 51D and the sensors 52A to 52D respectively corresponding to the light sources 51A to 51D, and the electrostatic sensors may be attached to the support lugs 4A to 4D, respectively, to measure the position of the fork 3A or such. The position of a wafer W relative to the fork 3A or such may be measured from an image formed by a camera. If a camera is used, only positional information about four points on the edge of a wafer W is sufficient. Therefore, four cameras are not necessarily needed and the positional information about the four points may be obtained by a single camera. If a single camera is used, the camera may be supported on a support member attached to the base 31 at a position above the two forks 3A and 3B.

Similarly to the positioning method using the sensors 52A to 52D to position a wafer W, positional information about four points on the edge of a wafer W is obtained by processing an image of the wafer W supported on the arm 3A (3B) held at the home position formed by the camera. Then, it is decided whether or not any one of the four points corresponds to a notch WN formed in the wafer W on the basis of the positional information about the four points. If it is decided that some one of the four points corresponds to the notch WN, the position of the wafer W relative to the fork 3A or such can be determined from the positional information about the three points other than the point corresponding to the notch WN.

A light source 51 provided with a single LED and a straight light-conductive member disposed on the light emitting side of the LED may be used instead of the light sensor 51 provided with LEDs as mentioned above. Any one of various linear image sensors including linear fiber sensors and photoelectric sensors may be used instead of the sensor 52, namely, the linear CCD sensor.

The positioning method of positioning the fork 3A with respect to the Z-axis described above with reference to FIGS. 12A to 12F is applicable to a fork provided with an electrostatic sensor instead of the vacuum mechanism including the vacuum sensor.

Although the position o of the center of a wafer at the correct position is used for determining the position of a wafer W relative to the fork 3A, one or a plurality of position marks may be formed on the fork 3A and the dislocation of the wafer W relative to the fork 3A may be determined on the basis of the position marks instead of using the position o of the center of the wafer at the correct position.

Figure 13C:
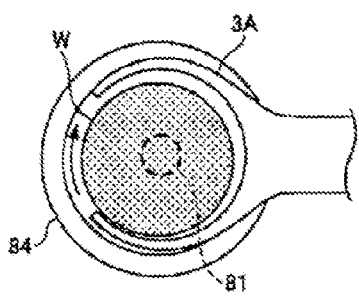
Figure 13D:
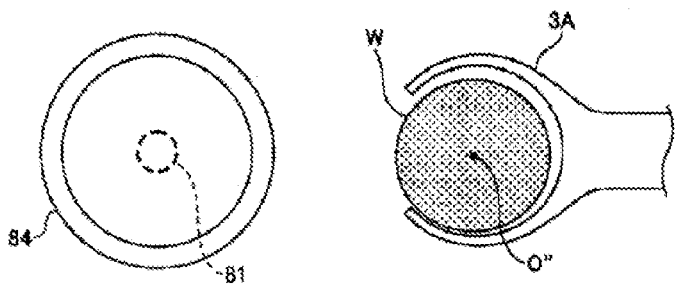

The fork positioning method of positioning the fork 3A with Respect to the X- and the Y-direction can be executed between the one fork and the other fork. For example, the fork 3A is withdrawn in FIG. 13B, the fork 3B of the carrying arm A3 may be moved to a position above the cup 84 in FIG. 13C, and then the wafer W may be carried away in FIG. 13D. In such a case also, the center of rotation of the spin chuck 81 can be determined by using data on the position o' of the center of the wafer W before the wafer W is transferred to the spin chuck 81 and data on the position o" of the center of the wafer W after the wafer W has been transferred to the spin chuck 81.

In a state shown in FIG. 18G, the fork to be moved into the thermal module TM need not be limited to the fork 3A of the carrying arm A3 and may be another fork. In such a case, since the position of the wafer W determined by the wafer support pads 96 is a correct position in this module, another fork can be positioned when the position of the center of the correctly positioned wafer W is made to coincide with the position of the center of another fork. Such positioning can be suitably applicable to, for example, the relation between the carrying mechanism D capable accessing, for example, the transfer module TRS of the shelf unit U1 of the coating and developing system 100 shown in FIG. 1 and the carrying arms A1, A2 and A4 (FIG. 2).

Although the embodiment in which the four wafer support pads 96 are placed on the support plate 93 of the thermal module TM has been described by way of example, the number of the support pads 96 may be three or above. The shape of the upper parts 96b of the wafer support pads 96 does not need necessarily be a truncated circular cone, provided that the upper parts 96b has a inclined surface and the wafer W can be positioned by the lower ends of the inclined surfaces and the upper surfaces of the lower parts 96a of the wafer support pads 96. That is, the wafer support pads 96 are satisfactory when wafer support parts 96 are formed in a shape such that a wafer W can move down to the upper surfaces of the lower parts 96a with its edge in contact with the inclined surfaces sliding down along the inclined surfaces. For example, the upper parts 96b may be triangular plates set on the upper surfaces of the lower parts 96a, respectively, and the surfaces of the respective sides of the triangular plates may be used as inclined surfaces.

Although the coating module 23 provided with the spin chuck 81 has been described by way of example, the coating module 23 may be provided with a rotating mechanism that holds a wafer W by the edge.

Preferably, the fork positioning method is executed, for example, for all the modules, data on reference positions with respect to directions along the X-, the Y- and the Z-axis in the modules is stored, and the data on the reference position in the module is retrieved to calibrate the position of the fork 3A before carrying a wafer W to the module.

Wafers W are not limited to semiconductor wafers and may be glass substrates for FPDs.

The invention claimed is:

1. A thermal processing apparatus for thermal processing a substrate comprising:
   a cooling plate that is configured to be movable between a first position and a second position, and to cool a substrate which is placed on the cooling plate, the cooling plate having a width and a length greater than a diameter of the substrate, with the first position being a position where the substrate is carried in and carried out;
   a heating plate for heating the substrate which has been cooled and transferred from the cooling plate, the heating plate having a circular shape of a diameter greater than a diameter of the substrate, with the second position being a position above the heating plate; and
   a support plate non-movably disposed in a position below the first position, the support plate having a plurality of support members for supporting the substrate thereon, the support members being configured to be brought into contact with an edge of the substrate to restrict horizontal displacement of the substrate so as to locate the substrate at a position where a center of the substrate is aligned with a center of the cooling plate positioned in the first position.

2. The thermal processing apparatus for thermal processing a substrate according to claim 1, wherein the support member has a shape of a truncated circular cone.

3. A positioning method of positioning substrate transfer position using a thermal processing apparatus according to claim 1,
   the thermal processing apparatus further comprising:
   a base capable of being vertically moved by an elevating axis and capable of being turned about a vertical axis by a turning mechanism; and
   a substrate holder being advanced and retracted between an end part of the base and a forward side of the base by a horizontal moving mechanism provided on the base;
   the positioning method of positioning substrate transfer position comprising:
   a first measuring step of measuring at least three first edge positions of the substrate by position measuring units, the substrate being held on the substrate holder positioned at the end part of the base;
   a positioning step of transferring the substrate to the plurality of support members and positioning the substrate by the plurality of support members;
   a retracting step of receiving the substrate by the substrate holder and retracting the substrate holder to the end part of the base;
   a second measuring step of measuring at least three second edge positions of the substrate received by the substrate holder by the position measuring units;
   a determining step of determining a first position of a center of the substrate on the basis of the first edge positions gained in the first measuring step and determining a second position of a center of the substrate on the basis of the second edge positions gained in the second measuring step and determining a reference position of center of the substrate on the basis of the first position of a center of the substrate and the second position of a center of the substrate; and
   an adjusting step of adjusting a moving position to be set of the substrate holder on the basis of the reference position of a center of the substrate.

4. The positioning method of positioning substrate transfer position according to claim 3, wherein the position measuring units include four position measuring units, and the three position measuring units used in the first measuring step measure any edge positions of the substrate.

* * * * *